(12) United States Patent
Nakamura et al.

(10) Patent No.: US 8,404,564 B2
(45) Date of Patent: Mar. 26, 2013

(54) ADHESIVE FILM FOR SEMICONDUCTOR, COMPOSITE SHEET, AND METHOD FOR PRODUCING SEMICONDUCTOR CHIP USING THEM

(75) Inventors: Yuuki Nakamura, Hitachi (JP); Tsutomu Kitakatsu, Hitachi (JP); Youji Katayama, Hitachi (JP); Keiichi Hatakeyama, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 641 days.

(21) Appl. No.: 12/594,847
(22) PCT Filed: Mar. 31, 2008
(86) PCT No.: PCT/JP2008/056360
§ 371 (c)(1),
(2), (4) Date: Dec. 16, 2009
(87) PCT Pub. No.: WO2008/126717
PCT Pub. Date: Oct. 23, 2008

(65) Prior Publication Data
US 2010/0112783 A1 May 6, 2010

(30) Foreign Application Priority Data

Apr. 6, 2007 (JP) .............................. P2007-100480
Sep. 13, 2007 (JP) .............................. P2007-238395

(51) Int. Cl.
*H01L 21/00* (2006.01)
*H01L 21/301* (2006.01)
*H01L 21/78* (2006.01)
(52) U.S. Cl. ................. 438/462; 257/E21.599
(58) Field of Classification Search .................. 438/462; 257/E21.599
See application file for complete search history.

(56) References Cited

U.S. PATENT DOCUMENTS 5,536,584 A * 7/1996 Sotokawa et al. ............. 428/458
6,455,208 B1 * 9/2002 Yamashiki et al. ............... 430/7

(Continued)

FOREIGN PATENT DOCUMENTS

CN 100454493 1/2009
EP 1 266 926 12/2002

(Continued)

OTHER PUBLICATIONS

English translation of the International Preliminary Report on Patentability dated Oct. 22, 2009, for Application No. PCT/JP2008/056360, filed Mar. 31, 2008.

(Continued)

*Primary Examiner* — Mary Wilczewski
(74) *Attorney, Agent, or Firm* — Antonelli. Terry, Stout & Kraus, LLP.

(57) ABSTRACT

There is provided an adhesive film for a semiconductor, which can be attached to a semiconductor wafer at low temperature and which allows semiconductor chips to be obtained at high yield from the semiconductor wafer while sufficiently inhibiting generation of chip cracks and burrs. The adhesive film for a semiconductor comprises a polyimide resin that can be obtained by reaction between a tetracarboxylic dianhydride containing 4,4'-oxydiphthalic dianhydride represented by chemical formula (I) below and a diamine containing a siloxanediamine represented by the following general formula (II) below, and that can be attached to a semiconductor wafer at 100° C. or below.

[Chemical Formula 1]

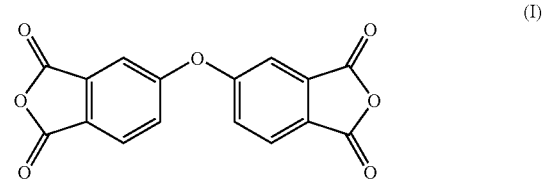

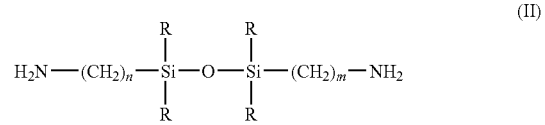

7 Claims, 14 Drawing Sheets

U.S. PATENT DOCUMENTS

| | | | |
|---|---|---|---|
| 6,600,006 B2 * | 7/2003 | Jung et al. | 528/353 |
| 6,887,580 B2 * | 5/2005 | Tokuhisa et al. | 428/473.5 |
| 7,141,614 B2 * | 11/2006 | Okada et al. | 522/46 |
| 7,843,045 B2 * | 11/2010 | Tateoka et al. | 257/676 |
| 2002/0093077 A1 * | 7/2002 | Jung et al. | 257/642 |
| 2003/0012882 A1 * | 1/2003 | Tokuhisa et al. | 427/385.5 |
| 2004/0265731 A1 * | 12/2004 | Okada et al. | 430/270.1 |
| 2006/0128065 A1 * | 6/2006 | Inada et al. | 438/118 |
| 2006/0199920 A1 * | 9/2006 | Okada et al. | 525/426 |
| 2007/0098995 A1 * | 5/2007 | Masuko et al. | 428/413 |
| 2009/0091012 A1 * | 4/2009 | Tateoka et al. | 257/676 |
| 2010/0059261 A1 * | 3/2010 | Watanabe et al. | 174/258 |
| 2010/0112783 A1 * | 5/2010 | Nakamura et al. | 438/458 |
| 2010/0142872 A1 * | 6/2010 | Egami et al. | 384/462 |
| 2011/0121435 A1 * | 5/2011 | Mitsukura et al. | 257/632 |
| 2012/0133061 A1 * | 5/2012 | Mitsukura et al. | 257/798 |

FOREIGN PATENT DOCUMENTS

| | | |
|---|---|---|
| EP | 2 139 027 A1 * | 12/2009 |
| JP | 10-036507 | 2/1998 |
| JP | 2002-192370 | 7/2002 |
| JP | 2003-332267 | 11/2003 |
| JP | 2003-338467 | 11/2003 |
| JP | 2004-210805 | 7/2004 |
| JP | 2004-277618 | 10/2004 |
| JP | 2006-203133 | 8/2006 |
| JP | 2007-056167 | 3/2007 |
| JP | 2008-252081 | 10/2008 |
| JP | 2011-046963 | 3/2011 |
| KR | 10-2006-0021337 | 3/2006 |
| WO | WO 2004/109786 A1 | 12/2004 |
| WO | WO 2004/111148 A1 | 12/2004 |
| WO | WO 2005/036633 | 4/2005 |

OTHER PUBLICATIONS

Korean Official Action issued Apr. 29, 2011, for KR Application No. 10-2009-7017861.

Japanese Official Action issued Mar. 13, 2012, for JP Application No. 2009-509250.

Taiwanese Official Action issued Dec. 20, 2011, for TW Application No. 097112297.

Extended European Search Report issued Jul. 11, 2012, for European Application No. 08739473.0.

Communication mailed Sep. 18, 2012, in connection with Japanese Patent Application No. 2009-509250, 1 page, Japanese Patent Office, Japan.

* cited by examiner

ADHESIVE FILM FOR SEMICONDUCTOR, COMPOSITE SHEET, AND METHOD FOR PRODUCING SEMICONDUCTOR CHIP USING THEM

TECHNICAL FIELD

The present invention relates to an adhesive film for a semiconductor, a composite sheet and a method for producing a semiconductor chip using them.

BACKGROUND ART

When a semiconductor chip is mounted on a supporting member, silver paste is conventionally used, for the most part, as the die bonding material to bond the semiconductor chip with the supporting member. However, as semiconductor chips become smaller with higher performance and the supporting members used also become smaller and more miniaturized, methods that employ silver pastes present problems including paste bleed-out and wire bonding troubles due to sloping of the semiconductor chip. In recent years, therefore, adhesive films (adhesive films for semiconductors) have come to be used in place of silver pastes.

Systems used to obtain semiconductor devices using adhesive films include short bar attachment systems and wafer back-side attachment systems.

In a short bar attachment system, short bars are cut out by cutting or punching from a reel-shaped adhesive film and the short bars of the adhesive film are bonded to a supporting member. Individuated semiconductor chips are joined to the supporting member by a separate dicing step, via the adhesive film bonded to the supporting member. A semiconductor device is then obtained, if necessary by a wire bond step, sealing step, or the like. In short bar attachment systems, however, a special assembly apparatus is necessary to cut out the adhesive film into short bars and bond them to the supporting member, and therefore production cost has been higher than methods using silver paste.

In a wafer back-side attachment system, first an adhesive film and dicing tape are attached in that order to the back side of a semiconductor wafer. The semiconductor wafer is diced for partitioning into a plurality of semiconductor chips, and the adhesive film is cut for each semiconductor chip. Next, the semiconductor chips are picked up together with the adhesive films laminated on their back sides, and the semiconductor chips are bonded to supporting members through the adhesive films. A semiconductor device is then obtained by further steps such as heating, curing and wire bonding. A wafer back-side attachment system does not require an assembly apparatus for individuation of the adhesive film, and a conventional assembly apparatus used for silver paste may be used either in its original form or with part of the apparatus modified by addition of a heating plate or the like. Among methods that employ adhesive films, therefore, this method has been of interest with the aim of helping to limit production cost.

Methods proposed for dicing semiconductor wafers, on the other hand, include stealth dicing, in which a semiconductor wafer is irradiated with laser light to selectively create reformed sections inside the semiconductor wafer, and the semiconductor wafer is cut along the reformed sections (Patent documents 1 and 2). In this method, dicing tape is stretched to apply stress to the semiconductor wafer, and the semiconductor wafer is partitioned into multiple semiconductor chips along the reformed sections.

[Patent document 1] Japanese Unexamined Patent Publication No. 2002-192370
[Patent document 2] Japanese Unexamined Patent Publication No. 2003-338467

DISCLOSURE OF THE INVENTION

Problems to be Solved by the Invention

Wafer back-side attachment systems require the adhesive film to be cut simultaneously during semiconductor wafer dicing. However, when the semiconductor wafer and adhesive film are simultaneously cut by ordinary dicing methods employing a diamond blade, cracking occurs on the side surfaces of the cut semiconductor chips (chip cracks), and the adhesive film becomes raised on the cut surfaces, producing numerous burrs. The presence of such chip cracks and burrs tends to result in cracking of the semiconductor chips during their pickup, thus lowering the yield.

In order to inhibit chip crack and burr formation, the present inventors have investigated a method comprising a step of preparing a laminated body having a semiconductor wafer, an adhesive film for a semiconductor and dicing tape laminated in that order, the semiconductor wafer being partitioned into multiple semiconductor chips and notches being formed from the semiconductor wafer side so that at least a portion of the adhesive film for a semiconductor remains uncut in its thickness direction, and a step of stretching out the dicing tape hi a direction so that the multiple semiconductor chips are separated apart, to separate the adhesive film for a semiconductor along the notches.

However, it was found that when a conventional adhesive film for a semiconductor is used for dicing by this method, it is difficult to completely separate the adhesive film for a semiconductor along the notches.

The stealth dicing method mentioned above can potentially inhibit the extent of chip cracks and burrs produced with dicing. However, it was also found that when the semiconductor wafers are partitioned by stretching out dicing tape after creating reformed sections in the semiconductor wafers by laser working, it is difficult to completely separate the adhesive film for a semiconductor simply by stretching out of the dicing tape, while it is also difficult to obtain high semiconductor chip yields in practice.

In addition, methods using laminated bodies with notches formed therein or methods of stealth dicing employ large amounts of filler included in the adhesive film, and although the adhesive film is easily cleaved and burr formation is somewhat prevented as a result, this also makes it difficult to attach the adhesive film to a semiconductor wafer at low temperature. In order to minimize warping of the semiconductor wafer and damage resulting from the thermal history of the members, it is preferred for adhesive films to be attachable to semiconductor wafers at the lowest temperature possible.

The present invention has been accomplished in light of the circumstances described above, and it is an object thereof to provide an adhesive film for a semiconductor which can be attached to a semiconductor wafer at low temperature and which allows semiconductor chips to be obtained at high yield from the semiconductor wafer while sufficiently inhibiting generation of chip cracks and burrs. It is another object of the invention to provide a method of using the adhesive film for a semiconductor to obtain semiconductor chips from a semiconductor wafer at high yield while sufficiently inhibiting generation of chip cracks and burrs.

Means for Solving the Problems

According to one aspect, the invention relates to an adhesive film for a semiconductor that can be attached to a semiconductor wafer at 100° C. or below. The adhesive film for a semiconductor according to the invention comprises a polyimide resin that can be obtained by reaction between a tetracarboxylic dianhydride containing 4,4'-oxydiphthalic dianhydride represented by chemical formula (I) below at 50% by mass or greater of the whole, and a diamine containing a siloxanediamine represented by the following general formula (II) below at 30% by mass or greater of the whole. In formula (II), R represents a C1-5 alkyl, C1-5 alkoxy, phenyl or phenoxy group, and multiple R groups in the same molecule may be the same or different, while n and m each independently represent an integer of 1-3.

[Chemical Formula 1]

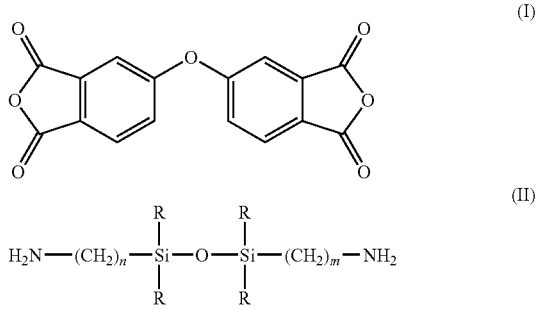

An adhesive film for a semiconductor according to the invention employing the specific polyimide resin described above allows attachment to semiconductor wafers at low temperature, while also facilitating complete separation without burrs when it is stretched out. As a result, the adhesive film for a semiconductor can be used to obtain semiconductor chips from a semiconductor wafer at high yield while sufficiently inhibiting generation of chip cracks and burrs.

The glass transition temperature of the polyimide resin is preferably from 30° C. to 80° C. If the glass transition temperature is within this range, attachment to semiconductor wafers at low temperature will be especially facilitated, while the adhesive film will be tackless or will have suitable tack at room temperature, thus providing advantages from the standpoint of workability and handleability.

The adhesive film for a semiconductor according to the invention may further contain a thermosetting component and filler. In this case, a filler content is preferably less than 30% by mass with respect to the mass of the adhesive film for a semiconductor. By lowering the filler content to some degree, it is possible to further facilitate attachment to semiconductor wafers at low temperature, and to further inhibit generation of reflow cracks.

According to another aspect, the invention relates to a composite sheet comprising an adhesive film for a semiconductor according to the invention as described above, and dicing tape laminated on one side of the adhesive film for a semiconductor. By using such a composite sheet it is possible to efficiently obtain a semiconductor chip and semiconductor device by simple steps.

An adhesive film for a semiconductor or composite sheet according to the invention as described above may be suitably used in a method for producing a semiconductor chip according to the invention, described hereunder.

The method for producing a semiconductor chip according to the invention comprises a step of preparing a laminated body having a semiconductor wafer, an adhesive film for a semiconductor of the invention and dicing tape laminated in that order, the semiconductor wafer being partitioned into multiple semiconductor chips and notches being formed from the semiconductor wafer side so that at least a portion of the adhesive film for a semiconductor remains uncut in its thickness direction, and a step of stretching out the dicing tape in a direction so that the multiple semiconductor chips are separated apart, to separate the adhesive film for a semiconductor along the notches.

The method for producing a semiconductor chip according to the invention may also comprise a step of preparing a laminated body having a semiconductor wafer, an adhesive film for a semiconductor of the invention and dicing tape laminated in that order, with reformed sections formed in the semiconductor wafer by laser working along a line for division of the semiconductor wafer into multiple semiconductor chips, and a step of stretching out the dicing tape in a direction so that the multiple semiconductor chips are separated apart, to partition the semiconductor wafer into multiple semiconductor chips while partitioning the adhesive film for a semiconductor along the reformed sections.

According to the production method of the invention, it is possible to obtain a high yield of semiconductor chips from a semiconductor wafer while sufficiently inhibiting generation of chip cracks and burrs.

Effect of the Invention

According to the invention there is provided an adhesive film for a semiconductor, which can be attached to a semiconductor wafer at low temperature and which allows semiconductor chips to be obtained at high yield from the semiconductor wafer while sufficiently inhibiting generation of chip cracks and burrs. The adhesive film for a semiconductor according to the invention is superior in terms of heat resistance (high adhesion and reflow crack resistance at high temperature) and reliability against humidity.

According to the production method of the invention it is possible to obtain a high yield of semiconductor chips from a semiconductor wafer while sufficiently inhibiting generation of chip cracks and burrs. The production method of the invention can also improve speed for processing of semiconductor devices.

EXPLANATION OF SYMBOLS

Figure 1:
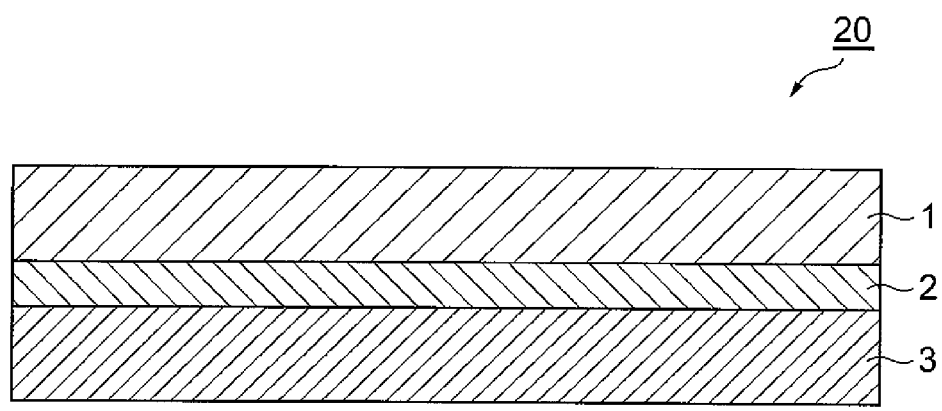
FIG. 1 is an end view showing a method for producing a semiconductor chip according to a first embodiment.

1: Semiconductor wafer, 1a: reformed section, 2: adhesive film for a semiconductor, 3: dicing tape, 4: dicing blade, 7: wiring-attached base, 8: bonding wire, 9: sealing resin layer, 10, 10a, 10b: semiconductor chips, 20: laminated body, 40: notch, 50: partitioning line, 100: semiconductor device.

BEST MODE FOR CARRYING OUT THE INVENTION

Preferred embodiments of the invention will now be described in detail. However, the present invention is not limited to the embodiments described below.

Adhesive Film for Semiconductor

An adhesive film for a semiconductor according to this embodiment can be attached to a semiconductor wafer at 100° C. or below. The adhesive film for a semiconductor is considered to be attachable to the semiconductor wafer if it is sufficiently anchored thereto so that it does not naturally peel off, when the adhesive film for a semiconductor kept at the prescribed temperature is attached to the semiconductor wafer, while being subjected to pressure as necessary. More specifically, the peel strength at the interface between the adhesive film for a semiconductor and the semiconductor wafer may be 20 N/m or greater, for example. The adhesive film for a semiconductor may be attached to the semiconductor wafer, for example, using a hot roll laminator set to a temperature of 100° C. or below. The peel strength is measured in an atmosphere at 25° C., with a pull angle of 90° and a pull speed of 50 mm/min. By reducing the filler content or using a polyimide resin with a low Tg (preferably not higher than 80° C.), for example, it is possible to obtain an adhesive film for a semiconductor that can be attached to a semiconductor wafer at 100° C. or below. The adhesive film for a semiconductor is preferably attachable to the semiconductor wafer at a temperature of not higher than 95° C. and more preferably not higher than 90° C.

The adhesive film for a semiconductor according to this embodiment contains a polyimide resin having a structural unit represented by the following general formula (A). The polyimide resin may be obtained, for example, by a process comprising a step of producing polyamic acid by reaction between a tetracarboxylic dianhydride and a diamine, and a step of producing a polyimide resin from the polyamic acid. $R^1$ in formula (10) is a tetravalent residue from the tetracarboxylic dianhydride, and $R^2$ is a divalent residue from the diamine.

[Chemical Formula 2]

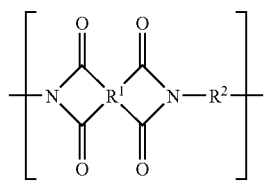

(A)

The tetracarboxylic dianhydride used to obtain the polyimide resin may be 4,4'-oxydiphthalic dianhydride (hereinafter also referred to as "ODPA") represented by the following chemical formula (I). In other words, the polyimide resin contains a structural unit represented by the following general formula (I-A). $R^2$ in formula (I-A) has the same definition as $R^2$ in formula (A).

[Chemical Formula 3]

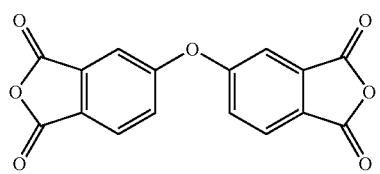

(I)

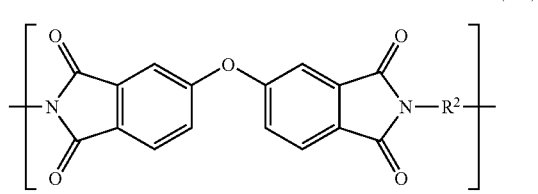

(I-A)

Preferably, at least 50% by mass of the tetracarboxylic dianhydride used for synthesis of the polyimide resin is ODPA. An ODPA proportion of less than 50% by mass will tend to lower the humidity resistance and tear resistance of the adhesive film. From the same viewpoint, the proportion of ODPA is more preferably 60% by mass or greater and even more preferably 70% by mass or greater.

The tetracarboxylic dianhydride may consist of ODPA alone, but it may alternatively also contain a compound other than ODPA. As examples of compounds to be used together with ODPA, there may be mentioned pyromellitic dianhydride, 3,3',4,4'-biphenyltetracarboxylic dianhydride, 2,2',3,3'-biphenyltetracarboxylic dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 2,3,3',4'-benzophenonetetracarboxylic dianhydride, 1,2,5,6- naphthalenetetracarboxylic dianhydride, 2,3,6,7-naphthalenetetracarboxylic dianhydride, 1,2,4,5-naphthalene-tetracarboxylic dianhydride, 1,4,5,8-naphthalene-tetracarboxylic dianhydride, 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride), 1,18-(octadecamethylene)bis(trimellitate anhydride), 2,6-dichlornaphthalene-1,4,5,8-tetracarboxylic dianhydride, 2,7-dichlornaphthalene-1,4,5,8-tetracarboxylic dianhydride, 2,3,6,7-tetrachlornaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,4,5-tetracarboxylic dianhydride, 2,3,3',4'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitate anhydride), ethylenetetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2.2.1]heptane-2,3-dicarboxylic anhydride)sulfone, bicyclo[2.2.2]oct-7-ene-2,3,5,6-tetracarboxylic dianhydride, 2,2-bis(3,4-dicarboxyphenyl)hexafluoropropane dianhydride, 2,2-bis[4-(3,4-dicarboxyphenoxy)phenyl]hexafluoropropane dianhydride, 4,4'-bis(3,4-dicarboxyphenoxy)diphenylsulfide dianhydride, 1,4-bis(2-hydroxyhexafluoroisopropyl)benzenebis(trimellitic anhydride), 1,3-bis(2-hydroxyhexafluoroisopropyl)benzenebis(trimellitic anhydride), 5-(2,5-dioxotetrahydrofuryl)-3-methyl-3-cyclohexene-1,2-dicarboxylic dianhydride and tetrahydrofuran-2,3,4,5-tetracarboxylic dianhydride. These may be used alone or in combinations of two or more.

The diamine used to obtain the polyimide resin may be a siloxanediamine represented by the following general formula (II). In other words, the polyimide resin contains a structural unit represented by the following general formula (II-A). $R^1$, n and m in formula (II-A) have the same definitions as $R^1$, n and m in formula (A). The polyimide resin of this embodiment will usually include a structural unit represented by the following general formula (10). The structural unit of formula (10) corresponds to either the structural unit of formula (I-A) or the structural unit of formula (II-A).

[Chemical Formula 4]

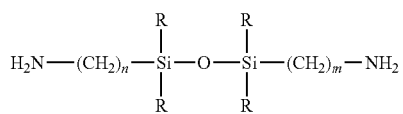

(II)

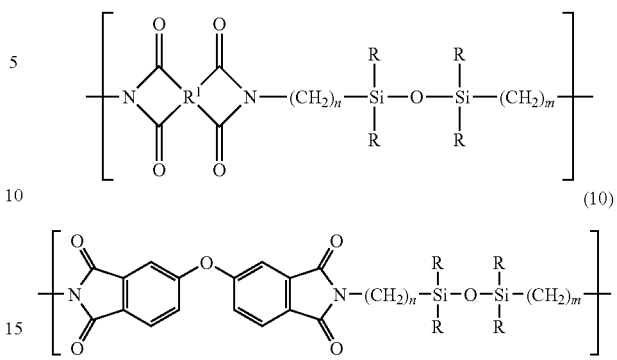

In this formula, R represents a C1-5 alkyl, C1-5 alkoxy, phenyl or phenoxy group, and multiple R groups in the same molecule may be the same or different, while n and m each independently represent an integer of 1-3. R is preferably a C1-5 alkyl group, and most typically a methyl group. The letters n and m are preferably 3.

As specific examples of siloxanediamines of formula (II) there may be mentioned 1,1,3,3-tetramethyl-1,3-bis(2-aminoethyl)disiloxane, 1,1,3,3-tetramethyl-1,3-bis(3-aminopropyl)disiloxane, 1,1,3,3-tetraphenyl-1,3-bis(2-aminoethyl)disiloxane and 1,1,3,3-tetraphenyl-1,3-bis(3-aminopropyl)disiloxane.

Preferably, 30% by mass-100% by mass of the diamine used to synthesize the polyimide resin is a siloxanediamine of formula (II). If the proportion of siloxanediamines of formula (II) is less than 30% by mass it will be difficult to obtain an adhesive film that is attachable to semiconductor wafers at 100° C. or below, and it will tend to be difficult to cleave the adhesive film without burrs when it is stretched out. From the same viewpoint, the proportion of siloxanediamines of formula (II) is more preferably 40% by mass or greater and even more preferably 50% by mass or greater.

The diamine used to synthesize the polyimide resin may consist of a siloxanediamine of formula (II) alone, but it may further include one or more compounds selected from the group consisting of aliphatic diamines, aromatic diamines, and siloxanediamines other than siloxanediamines of formula (II). As examples of aliphatic diamines there may be mentioned ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane and 1,12-diaminododecane. As examples of aromatic diamines there may be mentioned o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, 3,3'-diaminodiphenyldifluoromethane, 3,4'-diaminodiphenyldifluoromethane, 4,4'-diaminodiphenyldifluoromethane, 3,3'-diaminodiphenylsulfone, 3,4'-diaminodiphenylsulfone, 4,4'-diaminodiphenylsulfone, 3,3'-diaminodiphenylsulfide, 3,4'-diaminodiphenyl sulfide, 4,4'-diaminodiphenyl sulfide, 3,3'-diaminodiphenylketone, 3,4'-diaminodiphenylketone, 4,4'-diaminodiphenylketone, 2,2-bis(3-aminophenyl)propane, 2-(3-aminophenyl)-2-(4'-aminophenyl)propane, 2,2-bis(4-aminophenyl)propane, 2,2-bis(3-aminophenyl)hexafluoropropane, 2-(3-aminophenyl)-2-(4'-aminophenyl)hexafluoropropane, 2,2-bis(4-aminophenyl)hexafluoropropane, 1,3-bis (3-aminophenoxy)benzene, 1,4-bis(3-aminophenoxy)benzene, 1,4-bis(4-aminophenoxy)benzene, 3,3'-(1,4-phenylenebis(1-methylethylidene))bisaniline, 3,4'-(1,4-phenylenebis(1-methylethylidene))bisaniline, 4,4'-(1,4-phenylenebis(1-methylethylidene))bisaniline, 2,2-bis(4-(3-aminophenoxy)phenyl)propane, 2,2-bis(4-(4-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminophenoxy)phenyl)sulfide, bis(4-(4-aminophenoxy)phenyl)sulfide, bis(4-(3-aminophenoxy)phenyl)sulfone and bis(4-(4-aminophenoxy)phenyl)sulfone.

Siloxanediamines that may be used together with a siloxanediamine of formula (II) are represented by the following general formula (III), for example. In formula (II), $Q^1$ and $Q^2$ each independently represent phenylene or a C1-5 alkylene group (being limited to a C4-5 alkylene group when p is 1), $Q^3$, $Q^4$, $Q^5$ and $Q^6$ each independently represent C1-5 alkyl, C1-5 alkoxy, phenyl or phenoxy, and p represents an integer of 1-50.

[Chemical Formula 5]

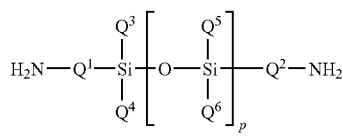

(III)

As siloxanediamines of formula (III) there may be mentioned 1,1,3,3-tetramethyl-1,3-bis(4-aminophenyl)disiloxane, 1,1,3,3-tetraphenoxy-1,3-bis(2-aminoethyl)disiloxane, 1,1,3,3-tetramethyl-1,3-bis(4-aminobutyl)disiloxane and 1,3-dimethyl-1,3-dimethoxy-1,3-bis(4-aminobutyl)disiloxane when p is 1,1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl)trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane and 1,1,3,3,5,5-hexapropyl-1,5-bis(3-aminopropyl)trisiloxane when p is 2, and compounds represented by the following chemical formula when p is 3-50. Two or more of these may also be used in admixture.

[Chemical Formula 6]

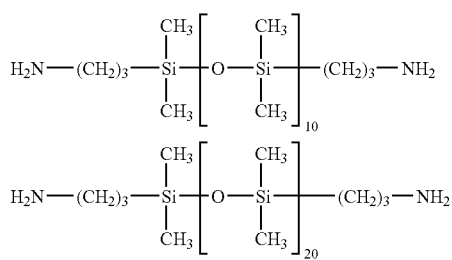

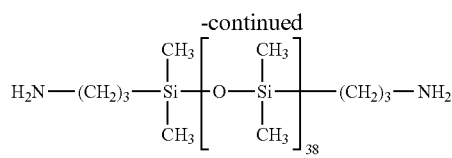

From the viewpoint of optimizing the handleability and tack strength of the adhesive film at room temperature, the glass transition temperature of the polyimide resin is preferably from 30° C. to 80° C. If the glass transition temperature of the polyimide resin is below 30° C., the polyimide resin will be soft at room temperature, leading to problems with handleability and storage stability. If the glass transition temperature of the polyimide resin is above 80° C., it may be difficult to accomplish attachment to wafers at 100° C. or below. From the same viewpoint, the glass transition temperature of the polyimide resin is more preferably from 40° C. to 80° C. and even more preferably from 45° C. to 80° C.

The reaction for production of the polyimide resin from a tetracarboxylic dianhydride and diamine may be conducted under appropriate conditions generally employed for polyimide resin synthesis reactions, as are well known to those skilled in the art.

The adhesive film for a semiconductor may contain a thermosetting component and/or filler in addition to the polyimide resin. A thermosetting component is a component that can be hardened when it forms a three-dimensional network structure under heating, and for example, it may be composed of a thermosetting resin and its curing agent and/or curing accelerator. Using a thermosetting component will tend to increase the shear adhesive force at high temperature. However, since a thermosetting component will also tend to lower the peel adhesive force at high temperature, the use of a thermosetting component may be appropriately determined according to the purpose.

The amount of thermosetting resin is preferably 1-100 parts by weight and more preferably 1-50 parts by weight with respect to 100 parts by weight of the polyimide resin. If it exceeds 100 parts by weight, the film formability will tend to be reduced.

The thermosetting resin is preferably selected from among epoxy resins and imide compounds having two thermosetting imide groups.

An epoxy resin used as the thermosetting resin is a compound having two or more epoxy groups. From the viewpoint of curability and cured properties, it is preferably a phenol glycidyl ether-type epoxy resin. As phenol glycidyl ether-type epoxy resins there may be mentioned condensation products of bisphenol A, bisphenol AD, bisphenol S, bisphenol F or halogenated bisphenol A with epichlorohydrin, as well as phenol-novolac resin glycidyl ether, cresol-novolac resin glycidyl ether and bisphenol A-novolac resin glycidyl ether. It is preferred to use an epoxy resin with 100-500 epoxy equivalents.

When an epoxy resin is used as the thermosetting resin, a phenol resin is preferably used as the curing agent. The phenol resin is preferably one with 50-600 OH equivalents. A phenol resin is a compound having two or more phenolic hydroxyl groups. As specific examples of phenol resins there may be mentioned phenol-novolac resin, cresol-novolac resin, bisphenol A-novolac resin, poly-p-vinylphenol and phenolaralkyl resins. When a phenol resin is used, the amount is preferably 1-300 parts by weight, more preferably 1-150 parts by weight and even more preferably 1-120 parts by weight with respect to 100 parts by weight of the epoxy resin. If it exceeds 300 parts by weight, the curability will tend to be reduced.

Examples of curing agents or curing accelerators to be used in combination with the epoxy resin include, in addition to phenol resins, also imidazoles, dicyandiamide derivatives, dicarboxylic acid dihydrazides, triphenylphosphine, tetraphenylphosphoniumtetraphenyl borate, 2-ethyl-4-methylimidazole-tetraphenyl borate and 1,8-diazabicyclo[5.4.0]undecene-7-tetraphenyl borate. Two or more of these may also be used in admixture. The amount of curing accelerator is preferably 0-50 parts by weight, more preferably 0.1-50 parts by weight and even more preferably 0.1-20 parts by weight with respect to 100 parts by weight of the epoxy resin. If the amount of curing accelerator exceeds 50 parts by weight, the shelf life will tend to be reduced.

When an epoxy resin, phenol resin and curing accelerator are used in combination, the composition of the adhesive film for a semiconductor may be, for example, 100 parts by weight of the polyimide resin, 1-100 parts by weight of the epoxy resin, 1-600 parts by weight of the phenol resin with respect to 100 parts by weight of the epoxy resin, and 0-50 parts by weight of the curing accelerator with respect to 100 parts by weight of the epoxy resin.

As examples of imide compounds to be used as thermosetting resins there may be mentioned orthobismaleimidebenzene, metabismaleimidebenzene, parabismaleimidebenzene, 1,4-bis(p-maleimidecumyl)benzene, 1,4-bis(m-maleimidecumyl)benzene and imide compounds represented by the following formulas (IV), (V) and (VI).

[Chemical Formula 7]

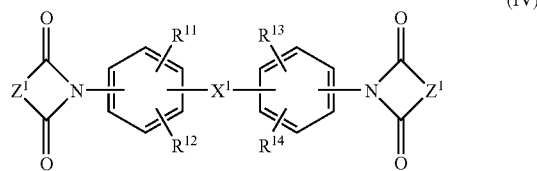

(IV)

In formula (IV), $X^1$ represents —O—, —CH$_2$—, —CF$_2$—, —SO$_2$—, —S—, —CO—, —C(CH$_3$)$_2$— or —C(CF$_3$)$_2$—, $R^{11}$, $R^{12}$, $R^{13}$ and $R^{14}$ each independently represent hydrogen, lower alkyl group, lower alkoxy group, fluorine, chlorine or bromine, and $Z^1$ represents a dicarboxylic acid residue with an ethylenic unsaturated double bond.

[Chemical Formula 8]

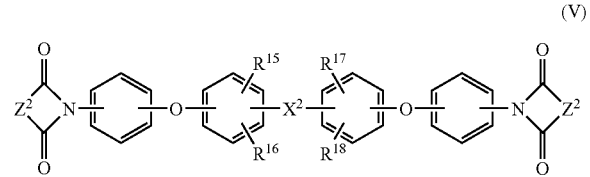

(V)

In formula (V), $X^2$ represents —O—, —CH$_2$—, —CF$_2$—, —SO$_2$—, —S—, —CO—, —C(CH$_3$)$_2$— or —C(CF$_3$)$_2$—, $R^{15}$, $R^{16}$, $R^{17}$, and $R^{18}$ each independently represent hydrogen, lower alkyl group, lower alkoxy group, fluorine, chlorine or bromine, and $Z^2$ represents a dicarboxylic acid residue with an ethylenic unsaturated double bond.

[Chemical Formula 9]

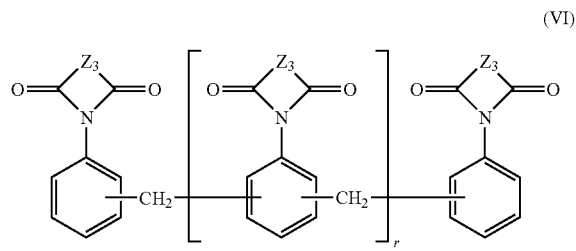

(VI)

In formula (VI), $Z^3$ represents a dicarboxylic acid residue with an ethylenic unsaturated double bond and r represents an integer of 0-4.

As examples of imide compounds of formula (IV) there may be mentioned 4,4'-bismaleimidediphenyl ether, 4,4'-bismaleimidediphenylmethane, 4,4'-bismaleimide-3,3'-dimethyl-diphenylmethane, 4,4'-bismaleimidediphenylsulfone, 4,4'-bismaleimidediphenyl sulfide, 4,4'-bismaleimidediphenylketone, 2,2-bis(4-maleimidephenyl)propane, 4,4'-bismaleimidediphenylfluoromethane and 1,1,1,3,3,3-hexafluoro-2,2-bis(4-maleimidephenyl)propane.

As examples of imide compounds of formula (V) there may be mentioned bis[4-(4-maleimidephenoxy)phenyl] ether, bis[4-(4-maleimidephenoxy)phenyl]methane, bis[4-(4-maleimidephenoxy)phenyl]fluoromethane, bis[4-(4-maleimidephenoxy)phenyl]sulfone, bis[4-(3-maleimidephenoxy)phenyl]sulfone, bis[4-(4-maleimidephenoxy)phenyl]sulfide, bis[4-(4-maleimidephenoxy)phenyl]ketone, 2,2-bis[4-(4-maleimidephenoxy)phenyl]propane and 1,1,1,3,3,3-hexafluoro-2,2-bis[4-(4-maleimidephenoxy)phenyl] propane.

A radical polymerization initiator may be used to accelerate curing of the imide compound. As radical polymerization initiators there may be mentioned acetylcyclohexylsulfonyl peroxide, isobutyryl peroxide, benzoyl peroxide, octanoyl peroxide, acetyl peroxide, dicumyl peroxide, cumene hydroperoxide and azobisisobutyronitrile. The amount of radical polymerization initiator used is preferably about 0.01-1.0 part by weight with respect to 100 parts by weight of the imide compound.

The filler is used for the purpose of improving the breaking strength and reducing the tensile breaking elongation of the adhesive film in the B-stage state, improving the handleability of the adhesive film, increasing the thermal conductivity, adjusting the melt viscosity and imparting a thixotropic property. The filler used may be a conductive filler selected from among silver powder, gold powder and copper powder, and non-metallic inorganic fillers containing inorganic materials.

As examples of inorganic materials for inorganic fillers there may be mentioned aluminum hydroxide, magnesium hydroxide, calcium carbonate, magnesium carbonate, calcium silicate, magnesium silicate, calcium oxide, magnesium oxide, alumina, aluminum nitride, aluminum borate whiskers, boron nitride, crystalline silica, amorphous silica and antimony oxide. Alumina, aluminum nitride, boron nitride, crystalline silica and amorphous silica are preferred for increased thermal conductivity. To adjust of the melt viscosity and impart a thixotropic property, aluminum hydroxide, magnesium hydroxide, calcium carbonate, magnesium carbonate, calcium silicate, magnesium silicate, calcium oxide, magnesium oxide, alumina, crystalline silica and amorphous silica are preferred. Alumina, silica, aluminum hydroxide and antimony oxide are preferred for increased humidity resistance. Different types of fillers may also be used in combination.

By increasing the filler content it is possible to increase the breaking strength and elastic modulus of the adhesive film, or produce greater toughness. An excessively high filler content, however, may reduce the adhesion of the adhesive film and lower the reflow crack resistance. In particular, the adhesive layer will be more prone to tearing when it is used for bonding between semiconductor chips and an adherend with an irregular surface such as an organic board. Increasing the filler may increase the temperature at which the adhesive film can attach to semiconductor wafers. From this viewpoint, the filler content is preferably less than 30% by mass, more preferably less than 25% by mass and even more preferably less than 20% by mass of the total mass of the adhesive film for a semiconductor. The filler content is also preferably at least 1 part by weight and more preferably at least 3 parts by weight with respect to 100 parts by weight of the polyimide resin.

The adhesive film for a semiconductor preferably has the heat resistance and humidity resistance required for mounting of a semiconductor chip onto a semiconductor chip mounting supporting member. It should therefore pass a reflow crack resistance test. The reflow crack resistance of the adhesive film for a semiconductor can be evaluated based on the adhesive strength. In order to obtain satisfactory reflow crack resistance, the peel strength is preferably at least 1.0 kg/cm initially, and at least 0.5 kg/cm after standing for 48 hours in an atmosphere at 85° C./85%, when the adhesive film for a semiconductor is attached to a semiconductor wafer with a 4×2 mm square bonding area. The initial peel strength is more preferably at least 1.3 kg and even more preferably 1.5 kg/cm. The peel strength after standing for 48 hours in an atmosphere at 85° C./85% is more preferably at least 0.7 kg/cm and even more preferably at least 0.8 kg/cm.

The tensile breaking elongation of the adhesive film for a semiconductor is preferably less than 5%. The tensile breaking elongation of the adhesive film for a semiconductor is preferably less than 110% with respect to the elongation at maximum load in a tensile test. With such a tensile characteristic, the adhesive film for a semiconductor will be resistant to raising of the ruptured surface when rupture occurs due to tensile stress, so that generation of burrs can be significantly prevented during production of semiconductor chips by the method described below. In addition, an adhesive film for a semiconductor with such a tensile characteristic can be efficiently and reliably separated with low expanding volume.

With a tensile breaking elongation of 5% or greater, it will be necessary for the expanding volume of the dicing tape to be greater than usual for complete separation of the adhesive film for a semiconductor. A proportion of 110% or greater for the tensile breaking elongation with respect to the elongation under maximum load corresponds to a long yield state or proneness to necking, and this will make it difficult to completely separate the adhesive film for a semiconductor 2 while preventing burrs.

From the same viewpoint, the tensile breaking elongation is more preferably less than 4% and even more preferably less than 3.5%. Similarly, the ratio of the tensile breaking elongation to the elongation under maximum load is more preferably less than 108% and even more preferably less than 105%. This ratio is a minimum of 100%, when the tensile breaking elongation and the elongation under maximum load are equal.

By constructing the adhesive film for a semiconductor with the components described above and appropriately adjusting the types of components and their amounts, it is possible to easily obtain an adhesive film for a semiconductor having the tensile characteristic specified above.

The maximum stress, maximum load elongation and tensile breaking elongation are determined by using a test strip with a width of 5 mm, a length of 50 mm and a thickness of 25 μm, cut out from the adhesive film for a semiconductor in the B-stage state, for a tensile test under the following conditions, in an environment at 25° C.

Tensile tester: 100N autograph "AGS-100NH" by Shimadzu
Length between chucks (at start of test): 30 mm
Pull rate: 5 mm/min The maximum load, length between chucks at maximum load and length between chucks at the time of rupture are read from a stress-strain curve obtained by the tensile test, and these values and the measured value for the cross-sectional area of the sample are used to calculate the maximum stress, maximum load elongation and tensile breaking elongation by the following formula.

$$\text{Maximum stress (Pa)} = \text{maximum load } (N)/\text{cross-sectional area of sample } (m^2)$$

$$\text{Elongation at maximum load (\%)} = \{(\text{length between chucks at maximum load (mm)} - 30)/30\} \times 100$$

$$\text{Tensile breaking elongation (\%)} = \{(\text{length between chucks at the time of rupture (mm)} - 30)/30\} \times 100$$

Normally, measurement is made for several test pieces, and the average value is recorded as the tensile characteristic of the adhesive film for a semiconductor. From the viewpoint of reproducibility the tensile test is preferably carried out under the conditions described above, but the conditions may be altered to other conditions that give substantially the same test results.

The adhesive film for a semiconductor may be obtained by a method in which, for example, a coating solution comprising a polyimide resin, a thermosetting component, a filler and an organic solvent which dissolves or disperses the foregoing (paste mixture) is coated onto a base film, and the organic solvent is removed from the coating solution on the base film by heating. The coating solution may be prepared by combining each of the materials and kneading them with an appropriate combination of dispersers such as a stirrer, kneader, triple roll, ball mill or the like.

The organic solvent is not particularly restricted so long as it allows uniform dissolution, kneading and dispersion of the materials, and as examples there may be mentioned dimethylformamide, dimethylacetamide, N-methylpyrrolidone, dimethyl sulfoxide, diethyleneglycol dimethyl ether, toluene, benzene, xylene, methyl ethyl ketone, tetrahydrofuran, ethylcellosolve, ethylcellosolve acetate, butylcellosolve and dioxane. These may be used alone or in combinations of two or more.

The base film is not particularly restricted so long as it can withstand the heating used for removal of the organic solvent. As examples of base films there may be mentioned polyester films, polypropylene films, polyethylene terephthalate films, polyimide films, polyetherimide films, polyether naphthalate films and methylpentene films. A multilayer film comprising two or more of these films may also be used as the base film. The surface of the base film may be treated with a release agent which is silicone-based, silica-based or the like. After removal of the organic solvent, the base film may be used by itself as the support of the adhesive film for a semiconductor without removal.

The adhesive film for a semiconductor may be stored and used as a composite sheet attached to dicing tape. Using such a composite sheet can simplify the semiconductor device production process.

Method for Producing Semiconductor Chip

First Embodiment

Figure 3:
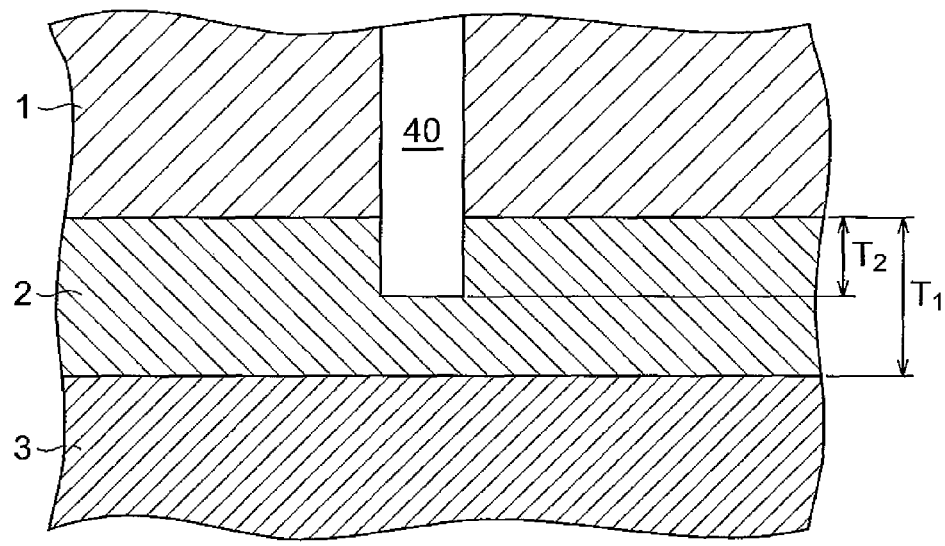
FIG. 3 is an end view showing a method for producing a semiconductor chip according to a first embodiment.
Figure 4:
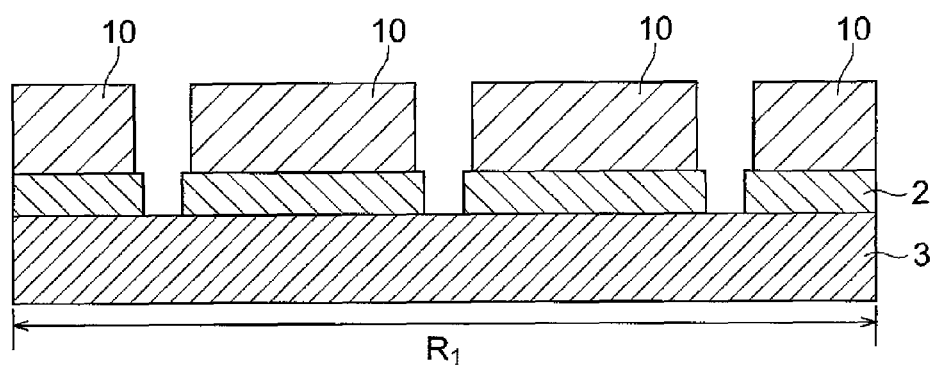
FIG. 4 is an end view showing a method for producing a semiconductor chip according to a first embodiment.
Figure 5:
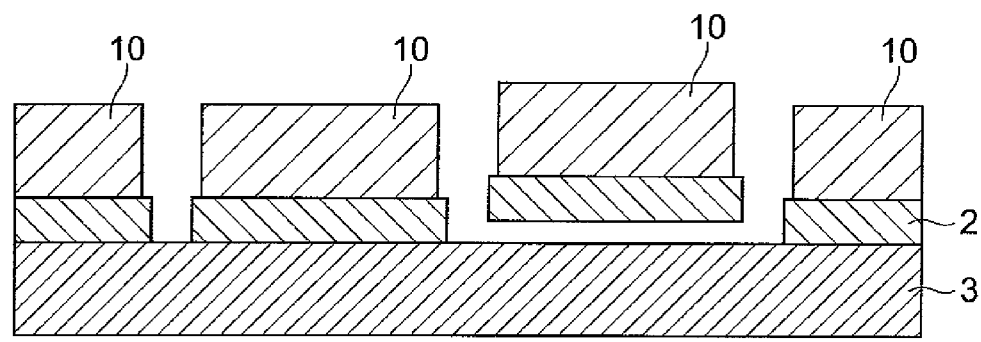
FIG. 5 is an end view showing a method for producing a semiconductor chip according to a first embodiment.
Figure 6:
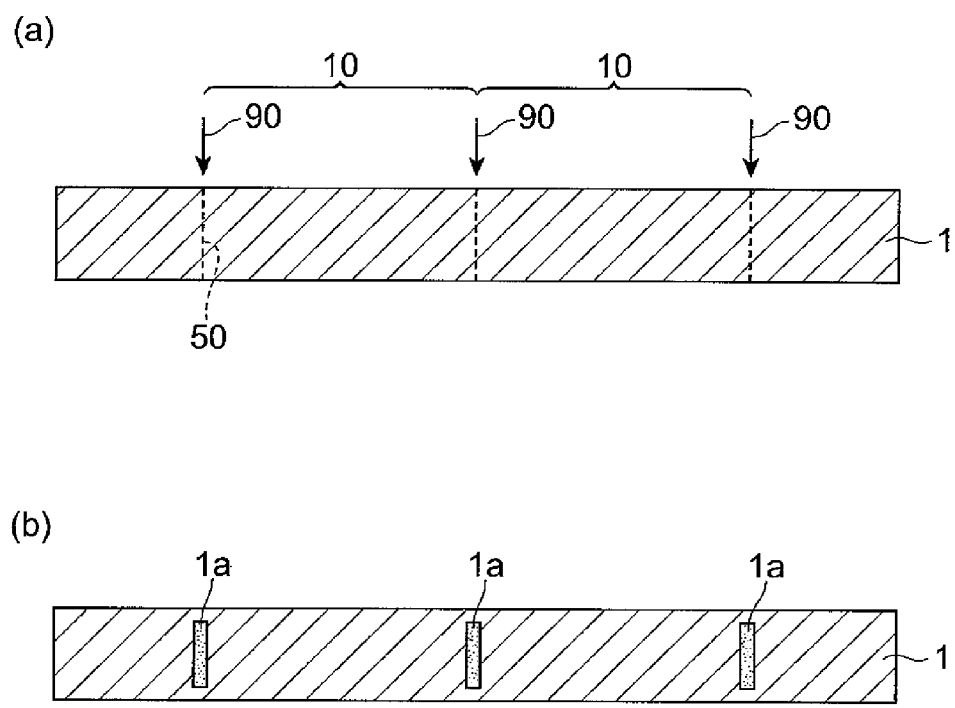
FIG. 6 is an end view showing a method for producing a semiconductor chip according to a second embodiment.

FIGS. 1, 2, 3, 4 and 5 are end views showing a method for producing a semiconductor chip according to a first embodiment. The method for producing a semiconductor chip according to this embodiment comprises a step of preparing a laminated body 20 obtained by laminating a semiconductor wafer 1, an adhesive film for a semiconductor 2 and a dicing tape 3 in that order (FIG. 1), a step of forming notches 40 in the laminated body 20 from one side of the semiconductor wafer 1 (FIGS. 2 and 3), a step of partitioning the adhesive film for a semiconductor 2 along the notches 40 (FIG. 4), and a step of pickup of semiconductor chips 10 together with the adhesive film for a semiconductor 2 (FIG. 5). The adhesive film for a semiconductor according to this embodiment is used as the adhesive film for a semiconductor 2.

The laminated body 20 in FIG. 1 is prepared by a method in which an adhesive film for a semiconductor 2 and a dicing tape 3 are attached in that order on the back side of a semiconductor wafer 1, or a composite sheet obtained by laminating the adhesive film for a semiconductor 2 and dicing tape 3 is attached to the back side of the semiconductor wafer 1 with the adhesive film for a semiconductor 2 facing the semiconductor wafer 1 side.

The semiconductor wafer 1 used is a wafer comprising single-crystal silicon, or polycrystalline silicon, a ceramic, or a compound semiconductor composed of gallium-arsenic. The dicing tape 3 is not particularly restricted so long as it has a sufficient adhesive property to allow anchoring onto an anchoring ring, and can be stretched out so that the adhesive film for a semiconductor 2 is partitioned. Vinyl chloride-based tape, for example, may be used as the dicing tape.

When the adhesive film for a semiconductor 2 or a composite sheet comprising it is attached to the semiconductor wafer 1, the temperature of the adhesive film for a semiconductor is preferably kept at 0-100° C. Attachment of the adhesive film for a semiconductor 2 at such a relatively low temperature will satisfactorily prevent warping of the semiconductor wafer 1 and damage resulting from the thermal history of the dicing tape or backgrind tape. From the same viewpoint, the temperature is more preferably 15° C.-95° C. and even more preferably 20° C.-90° C.

Figure 2:
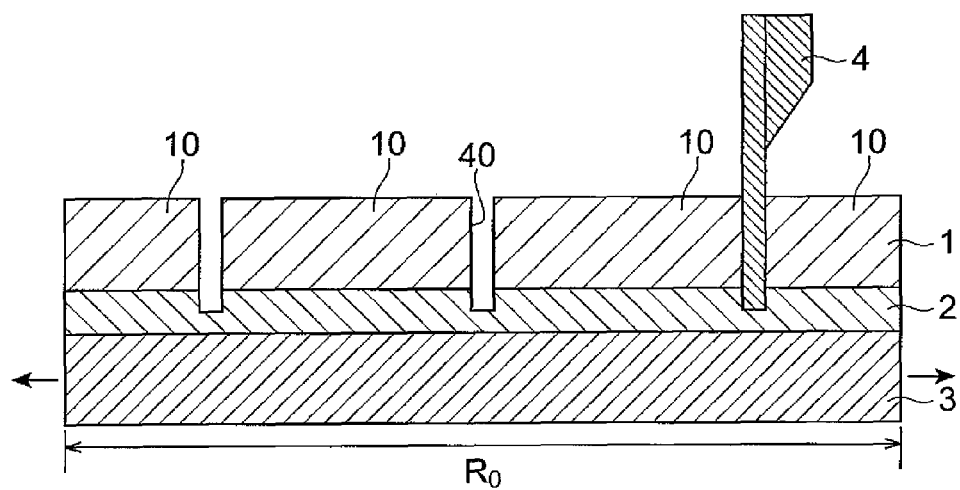
FIG. 2 is an end view showing a method for producing a semiconductor chip according to a first embodiment.

A dicing blade 4 is used to form notches 40 in the laminated body 20 from the semiconductor wafer 1 side, in such a manner that the semiconductor wafer 1 is partitioned into multiple semiconductor chips 10 while leaving a portion uncut in the direction of thickness of the adhesive film for a semiconductor 2 (FIG. 2). In other words, the semiconductor wafer 1 is completely cut while the adhesive film for a semiconductor 2 is half-cut along the lines on which the semiconductor wafer 1 is cut.

FIG. 3 is a magnified end view showing the area near a notch 40 formed in the laminated body 20. "Half-cut" means that the thickness T1 of the adhesive film for a semiconductor 2 and the depth T2 to which the adhesive film for a semiconductor 2 is notched satisfy the relationship $T2/T1<1$. $T2/T1$ is preferably $1/5$-$4/5$, more preferably $1/4$-$3/4$ and even more preferably $1/3$-$2/3$. A smaller T2 will tend to prevent generation of burrs when the adhesive film for a semiconductor 2 is partitioned along the notches 40, but will also tend to interfere with complete partitioning of the adhesive film for a semiconductor 2 even by stretching of the dicing tape 3 and increasing the thrusting height during pickup of the semiconductor chip 10. A larger T2 will tend to facilitate complete segmentation of the die bond film even with a low amount of stretching of the dicing tape (also referred to hereunder as "expanding volume"), and even with a low thrusting height during pickup of the semiconductor chip 10. However, an excessively large T2 will tend to reduce the effect against burrs and lower the effect of improved yield for production of semiconductor devices.

After forming the notches 40, the dicing tape 3 is stretched out in a direction such that the multiple semiconductor chips 10 are separated apart, i.e. in the direction along the main side of the dicing tape 3 (the direction of the arrow in FIG. 2), to partition the adhesive film for a semiconductor 2 (FIG. 4). As a result, the semiconductor chips 10 and the adhesive film-attached semiconductor chips having the adhesive film for a semiconductor 2 attached thereover become arranged on the dicing tape 3.

The expanding volume is the difference between the width (maximum width) of the dicing tape 3 after stretching $R_1$ and the initial width (maximum width) of the dicing tape 3 $R_0$ (see FIG. 2). The expanding volume is preferably 2 mm-10 mm, more preferably 2 mm-8 mm and even more preferably 2 mm-7 mm. Since the notches formed in the adhesive film for a semiconductor 2 as in this embodiment serve as starting points for cutting, the expanding volume may be reduced compared to a situation where the adhesive film for a semiconductor 2 is completely uncut, as in the second embodiment described hereunder.

After the dicing tape 3 has been stretched out, the semiconductor chips 10 are picked up together with the adhesive film for a semiconductor 2 attached onto the back side thereof (FIG. 5). The dicing tape 3 may be pushed up to a prescribed height from the side opposite the semiconductor chips 10, at the locations where the semiconductor chips 10 are to be picked up. The picked-up semiconductor chips 10 are mounted onto supporting members or the like using the adhesive film for a semiconductor 2 attached on their back sides as die bonding materials. The steps after pickup will be described below.

Second Embodiment

FIGS. 6, 7, 8 and 9 are end views showing a method for producing a semiconductor chip according to a second embodiment. The method according to this embodiment comprises a step of preparing a laminated body 20 obtained by laminating a semiconductor wafer 1, an adhesive film for a semiconductor 2 and a dicing tape 3 in that order (FIGS. 6-8), a step of stretching out the dicing tape 3 in a direction such that the plurality of semiconductor chips 10 separate from each other, to partition the adhesive film for a semiconductor 2 as the semiconductor wafer 1 is partitioned into a plurality of semiconductor chips 10 (FIG. 9), and a step of pickup of a semiconductor chips 10 together with the adhesive film for a semiconductor 2.

Figure 7:
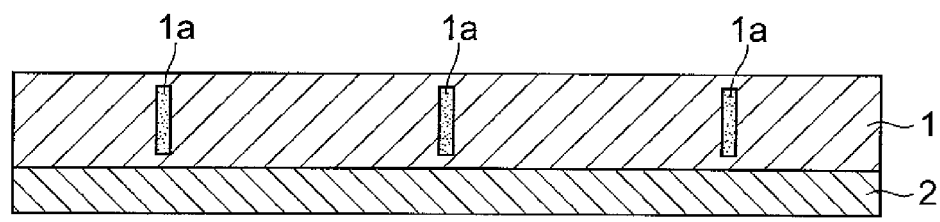
FIG. 7 is an end view showing a method for producing a semiconductor chip according to a second embodiment.
Figure 8:
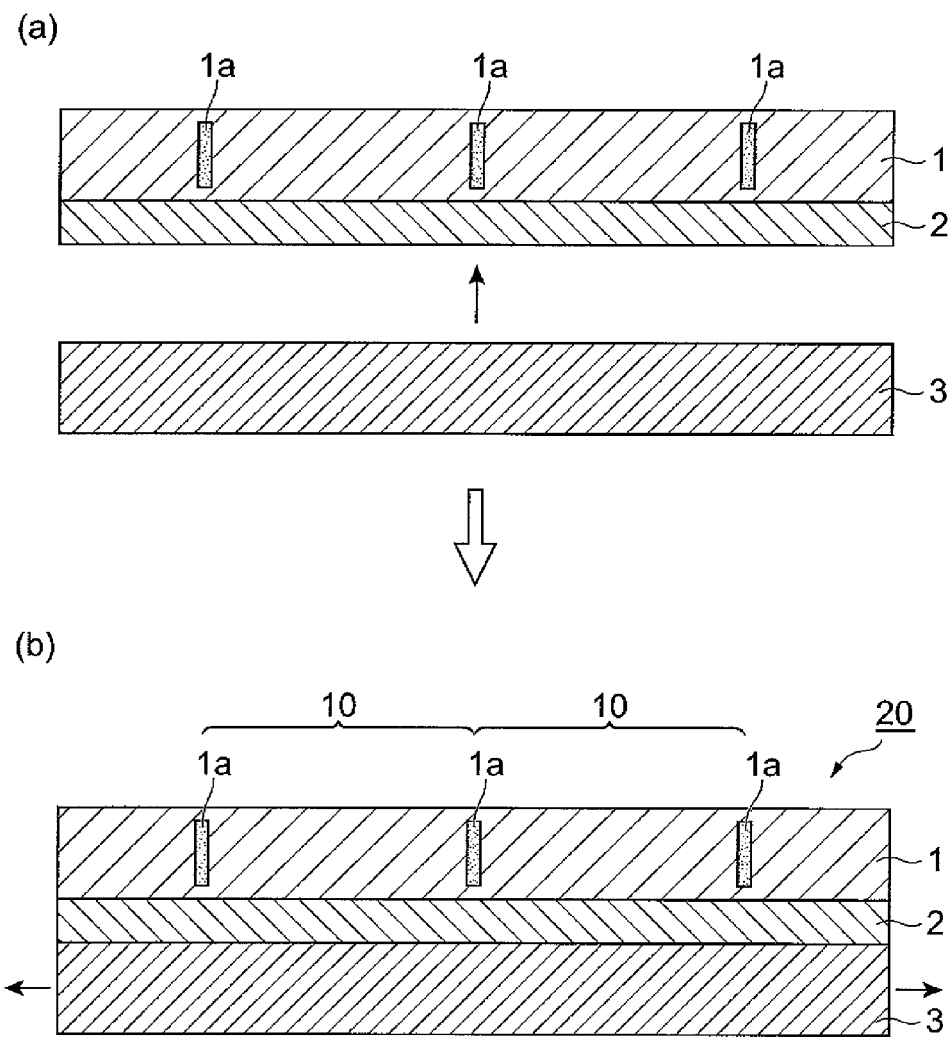
FIG. 8 is an end view showing a method for producing a semiconductor chip according to a second embodiment.

The step of preparing the laminated body 20 comprises a step of laser working to form reformed sections 1a inside the semiconductor wafer 1 along lines 50 that demarcate the semiconductor wafer 1 into multiple semiconductor chips 10 (hereinafter referred to as "division lines") (FIG. 6), a step of attaching an adhesive film for a semiconductor 2 onto the semiconductor wafer 1 in which the reformed sections 1a have been formed (FIG. 7), and a step of attaching dicing tape 3 onto the adhesive film for a semiconductor 2 (FIG. 8).

In the step of forming the reformed sections 1a by laser working, a laser 90 is irradiated along division lines 50 (FIG. 6(a)). The laser working may be carried out under conditions commonly employed for known "stealth dicing" methods. The laser working forms reformed sections 1a inside the semiconductor wafer 1.

Next, the adhesive film for a semiconductor 2 and dicing tape 3 are attached in that order onto the semiconductor wafer 1 as shown in FIGS. 7 and 8, to obtain a laminated body 20.

The steps for obtaining the laminated body 20 are not limited to the order of this embodiment. For example, the reformed sections may be formed by laser working after the adhesive film for a semiconductor has been attached onto the semiconductor wafer.

Figure 9:
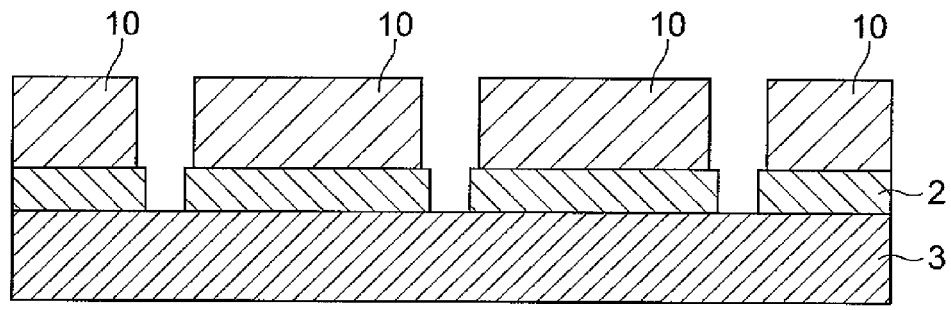
FIG. 9 is an end view showing a method for producing a semiconductor chip according to a second embodiment.

After the laminated body 20 has been obtained, the dicing tape 3 is stretched out in a direction such that the plurality of semiconductor chips 10 separate apart (direction of the arrow in FIG. 8(b)), to partition the semiconductor wafer 1 into multiple semiconductor chips 10 while also partitioning the adhesive film for a semiconductor 2 along the reformed sections 1a (FIG. 9).

According to this embodiment, the semiconductor wafer 1 and adhesive film for a semiconductor 2 are partitioned by stretching the dicing tape, without cutting with a dicing blade. This method does not require simultaneous cutting of the semiconductor wafer 1 and adhesive film for a semiconductor 2 with a dicing blade and can therefore increase the speed of individuation of the semiconductor wafer while inhibiting generation of burrs.

For this embodiment, the expanding volume of the dicing tape 3 is preferably 5-30 mm, more preferably 10-30 mm and even more preferably 10-20 mm. If the expanding volume is less than 5 mm it will tend to be difficult to completely separate the semiconductor wafer 1 and adhesive film for a semiconductor 2, while if it is greater than 30 mm, tearing will tend to occur at sections other than the sections along the division lines.

For this embodiment, the speed at which the dicing tape 3 is stretched out (the expanding speed) is preferably 10-1000 mm/sec, more preferably 10-100 mm/sec and even more preferably 10-50 mm/sec. If the expanding speed is less than 10 mm/sec it will tend to be difficult to completely separate the semiconductor wafer 1 and adhesive film for a semiconductor 2, while if it is greater than 1000 mm/sec, tearing will tend to occur at sections other than the sections along the division lines.

The semiconductor chips 10, that are obtained by the first embodiment or second embodiment as explained above and are picked up together the adhesive film for a semiconductor 2, are used to construct a semiconductor element such as an IC or LSI. For example, the semiconductor chips 10 are bonded onto supporting members via the adhesive film for a semiconductor 2 attached on their back sides. As examples for the supporting members there may be mentioned lead frames such as 42 alloy lead frames and copper lead frames, boards obtained by impregnating a resin film, nonwoven glass fabric or glass woven fabric formed from an epoxy resin, polyimide-based resin, maleimide-based resin or the like with a thermosetting resin such as an epoxy resin, polyimide-based resin or maleimide-based resin and curing the resin, as well as glass boards and ceramic boards of alumina and the like.

Figure 10:
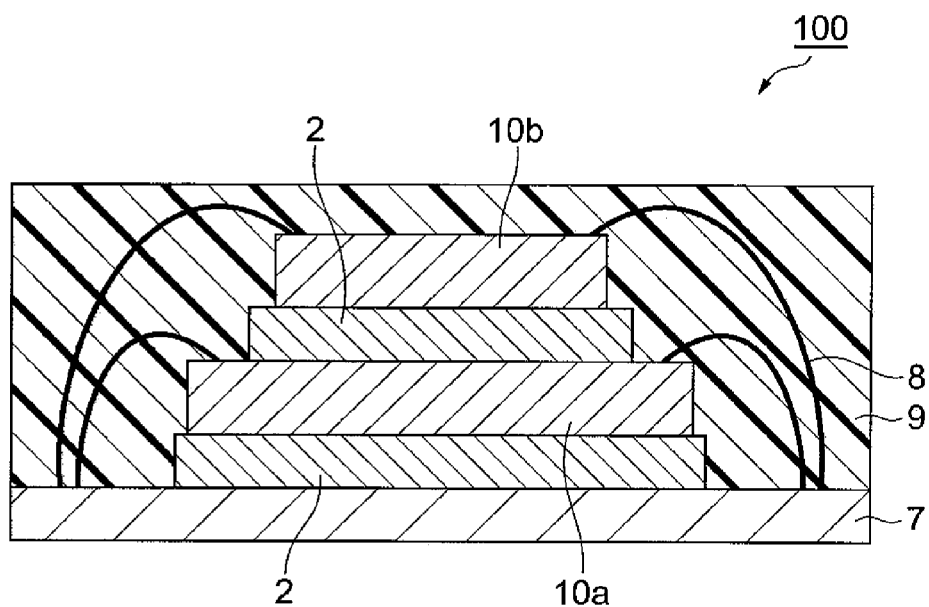
FIG. 10 is a cross-sectional view showing an embodiment of a semiconductor device.

The semiconductor chips may also be bonded together via the adhesive film for a semiconductor. FIG. 10 is a cross-sectional view showing an embodiment of a semiconductor device obtained by such a method. The semiconductor device 100 shown in FIG. 10 comprises a wiring-attached base (supporting member) 7, a semiconductor chip 10a bonded to the wiring-attached base 7 via the adhesive film for a semiconductor 2, and a semiconductor chip 10b bonded to the semiconductor chip 10a via the adhesive film for a semiconductor 2. The semiconductor chips 10a and 10b are connected to the wiring of the wiring-attached base 7 by bonding wire 8. The semiconductor chips 10a and 10b are sealed by a sealing resin layer 9 in which they are embedded.

Bonding between the semiconductor chip and supporting member and between the semiconductor chips is accomplished, for example, by heating at 60-300° C. for 0.1-300 seconds with the adhesive film for a semiconductor sandwiched between the semiconductor chip and supporting member or between the semiconductor chips.

When the adhesive film for a semiconductor 2 contains a thermosetting resin, the bonded semiconductor chips are preferably heated to promote adhesion and curing of the adhesive film for a semiconductor onto the adherend, for increased joint strength. The heating may be appropriately adjusted according to the composition of the adhesive film, and it will normally be 60-220° C. for 0.1-600 minutes. When resin sealing is carried out, the heating in the curing step for the sealing resin may be utilized.

EXAMPLES

The present invention will now be explained in greater detail by examples. However, the present invention is not limited to the examples described below.

1. Formation of Adhesive Films for Semiconductor

Example 1

After placing 1,3-bis(3-aminopropyl)tetramethyldisiloxane (0.1 mol) as a diamine and 150 g of N-methyl-2-pyrrolidone as the solvent in a 500 ml 4-necked flask equipped with a thermometer, stirrer and calcium chloride tube, the mixture was stirred at 60° C. Upon dissolution of the diamine, small portions of 1,10-(decamethylene)bis(trimellitate dianhydride) (0.02 mol) and 4,4'-oxydiphthalic dianhydride (0.08 mol) were added and reaction was conducted at 60° C. for 3 hours. This was followed by heating at 170° C. while blowing in $N_2$ gas, and removal of the water in the system over a period of 3 hours by azeotropic distillation together with part of the solvent. The NMP solution of the polyimide resin obtained by removal of the water was used to form an adhesive film.

To the NMP solution containing the polyimide resin obtained as described above (containing 100 parts by weight of polyimide resin) there were added 4 parts by weight of a cresol-novolac-type epoxy resin (product of Tohto Kasei Co., Ltd.), 2 parts by weight of 4,4'-[1-[4-[1-(4-hydroxyphenyl)-1-methylethyl]phenyl]ethylidene]bisphenol (product of Honshu Chemical Industry) and 0.5 part by weight of tetraphenylphosphoniumtetraphenyl borate (product of Tokyo Chemical Industry Co., Ltd.). There were further added a boron nitride filler (product of Mizushima Ferroalloy Co., Ltd.) at 12 wt % with respect to the total solid weight and AEROSIL (silica) filler R972 (product of Nippon Aerosil Co., Ltd.) at 3 wt % with respect to the total solid weight, and the mixture was thoroughly kneaded to obtain a varnish. The prepared varnish was coated onto a release-treated polyethylene terephthalate film and heated at 80° C. for 30 minutes and then at 120° C. for 30 minutes, after which the polyethylene terephthalate film was peeled off at room temperature (25° C.) to obtain an adhesive film with a thickness of 25 μm.

Examples 2-4

An adhesive film was obtained in the same manner as Example 1, except that the mixing ratio of the starting materials for synthesis of the polyimide resin was changed to the composition (parts by weight) listed in Table 1.

Comparative Example 1

An NMP solution of a polyimide resin was obtained in the same manner as Example 1, except that mixing ratio of the starting materials was changed to the composition (parts by weight) listed in Table 1. An adhesive film was also obtained in the same manner as Example 1, except that the obtained NMP solution of the polyimide resin was used, the mixing ratio of the boron nitride filler was 9 wt % with respect to the total solid weight, and no AEROSIL filler was used.

Comparative Example 2

An NMP solution of a polyimide resin was obtained in the same manner as Example 1, except that mixing ratio of the starting materials was changed to the composition (parts by weight) listed in Table 1. An adhesive film was also obtained in the same manner as Example 1, except that the obtained NMP solution of the polyimide resin was used, the mixing ratio of the boron nitride filler was 10 wt % with respect to the total solid weight, and no AEROSIL filler was used.

Comparative Example 3

An adhesive film was obtained in the same manner as Example 1, except that the mixing ratio of the boron nitride filler was 40 wt % with respect to the total solid weight, and no AEROSIL filler was used.

Comparative Example 4

An NMP solution of a polyimide resin was obtained in the same manner as Example 1, except that mixing ratio of the starting materials was changed to the composition (parts by weight) listed in Table 1. An adhesive film was obtained in the same manner as Example 1, except that the obtained NMP solution of the polyimide resin was used, the mixing ratio of the boron nitride filler was 28 wt % with respect to the total solid weight, and no AEROSIL filler was used.

Comparative Example 5

An adhesive film was obtained in the same manner as Example 1, except that the mixing ratio of the boron nitride filler was 50 wt % with respect to the total solid weight, and no AEROSIL filler was used.

Comparative Example 6

An adhesive film was obtained in the same manner as Example 1, except that the mixing ratio of the boron nitride filler was 57 wt % with respect to the total solid weight.

TABLE 1

|  |  | Examples | | | | Comparative Examples | | | | | |
|---|---|---|---|---|---|---|---|---|---|---|---|
|  |  | 1 | 2 | 3 | 4 | 1 | 2 | 3 | 4 | 5 | 6 |
| Acid anhydrides | ODPA | 50 | 80 | 80 | 70 | 0 | 0 | 0 | 0 | 0 | 80 |
|  | DBTA | 50 | 20 | 20 | 30 | 100 | 20 | 20 | 0 | 0 | 20 |
|  | BPADA | 0 | 0 | 0 | 0 | 0 | 80 | 80 | 100 | 100 | 0 |
| Diamines | LP7100 | 100 | 95 | 70 | 40 | 0 | 30 | 30 | 35 | 35 | 70 |
|  | B12 | 0 | 0 | 30 | 60 | 50 | 70 | 70 | 35 | 35 | 30 |
|  | D2000 | 0 | 5 | 0 | 0 | 0 | 0 | 0 | 30 | 30 | 0 |
|  | BAPP | 0 | 0 | 0 | 0 | 50 | 0 | 0 | 0 | 0 | 0 |

The abbreviations of the starting materials in Table 1 represent the following acid anhydrides or diamines.
(Acid Anhydrides)
ODPA: 4,4'-oxydiphthalic dianhydride (product of Manac, Inc.)
DBTA: 1,10-(decamethylene)bis(trimellitate dianhydride) (product of Kurogane Kasei Co., Ltd.)
BPADA: 2,2-bis[4-(3,4-dicarboxyphenoxy)phenyl]propane dianhydride (product of Kurogane Kasei Co., Ltd.)
(Diamines)
LP7100: 1,3-bis(3-aminopropyl)tetramethyldisiloxane (product of Shin-Etsu Chemical Co., Ltd.)
B12: 4,9-dioxadecane-1,12-diamine (product of BASF)
D2000: polyoxypropylenediamine 2000 (product of BASF)
BAPP: 2,2-bis-(4-(4-aminophenoxy)phenyl)propane (product of Wakayama Seika)

2. Evaluation of Adhesive Film (1) Maximum Stress, Maximum Load Elongation and Tensile Breaking Elongation A test strip (width: 5 mm, length: 50 mm) cut out from the adhesive film in the B-stage state was used for a tensile test. The maximum stress, maximum load elongation and tensile breaking elongation were determined from the obtained stress-strain curve, based on the following formulas. The tensile test was conducted using a tensile tester (100N autograph, AGS-100NH by Shimadzu) under conditions with an atmosphere at 25° C., a length between chucks of 30 mm at the start of the test and a pull rate of 5 mm/min.

Maximum stress (Pa)=maximum load ($N$)/cross-sectional area of sample ($m^2$)

Elongation at maximum load (%)=[(length between chucks at maximum load (mm)−30)/30]×100

Tensile breaking elongation (%)=[(length between chucks at the time of rupture (mm)−30)/30]×100

Figure 11:
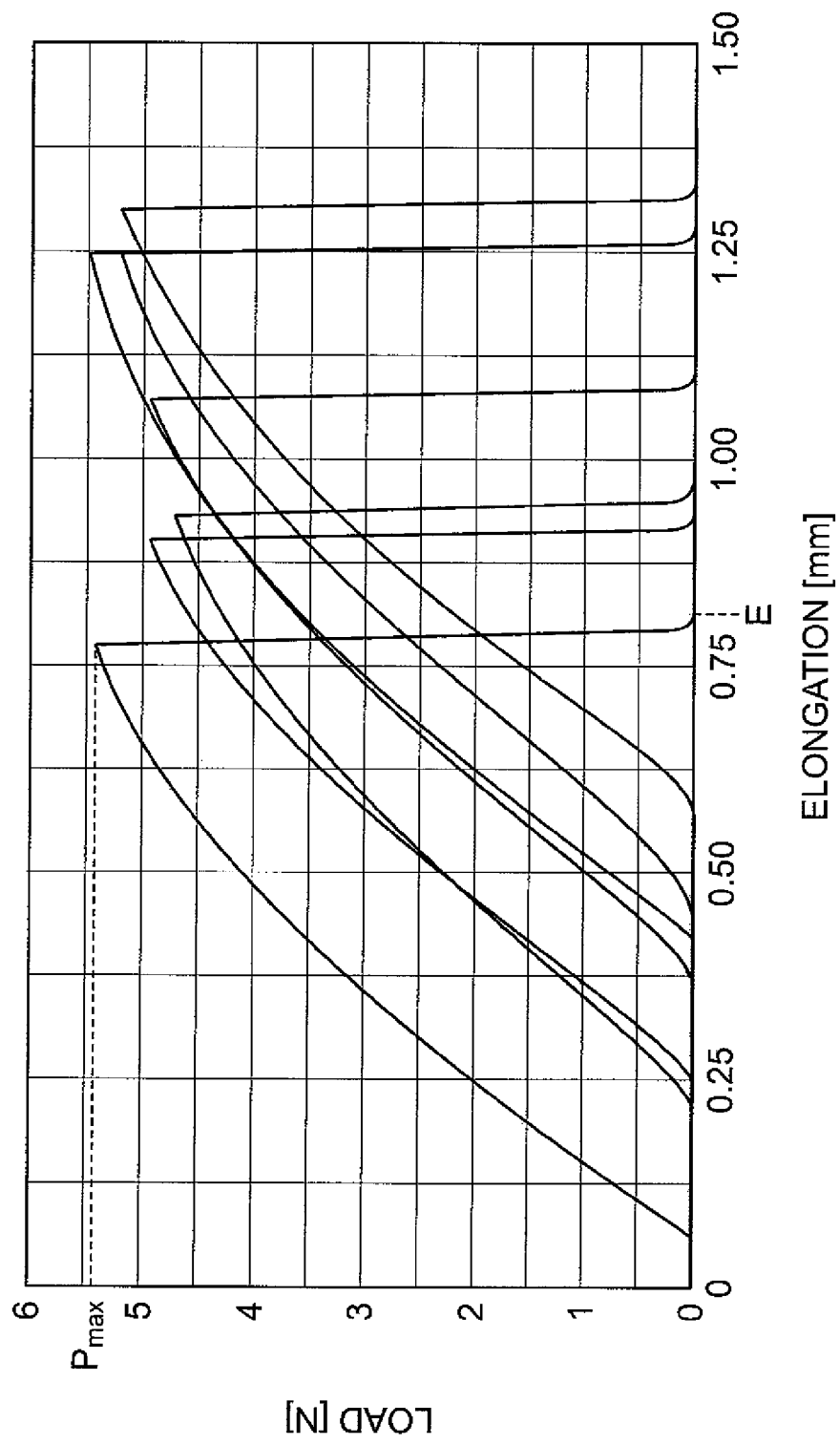
FIG. 11 is a view showing a stress-strain curve for a tensile test of an adhesive film for a semiconductor.
Figure 12:
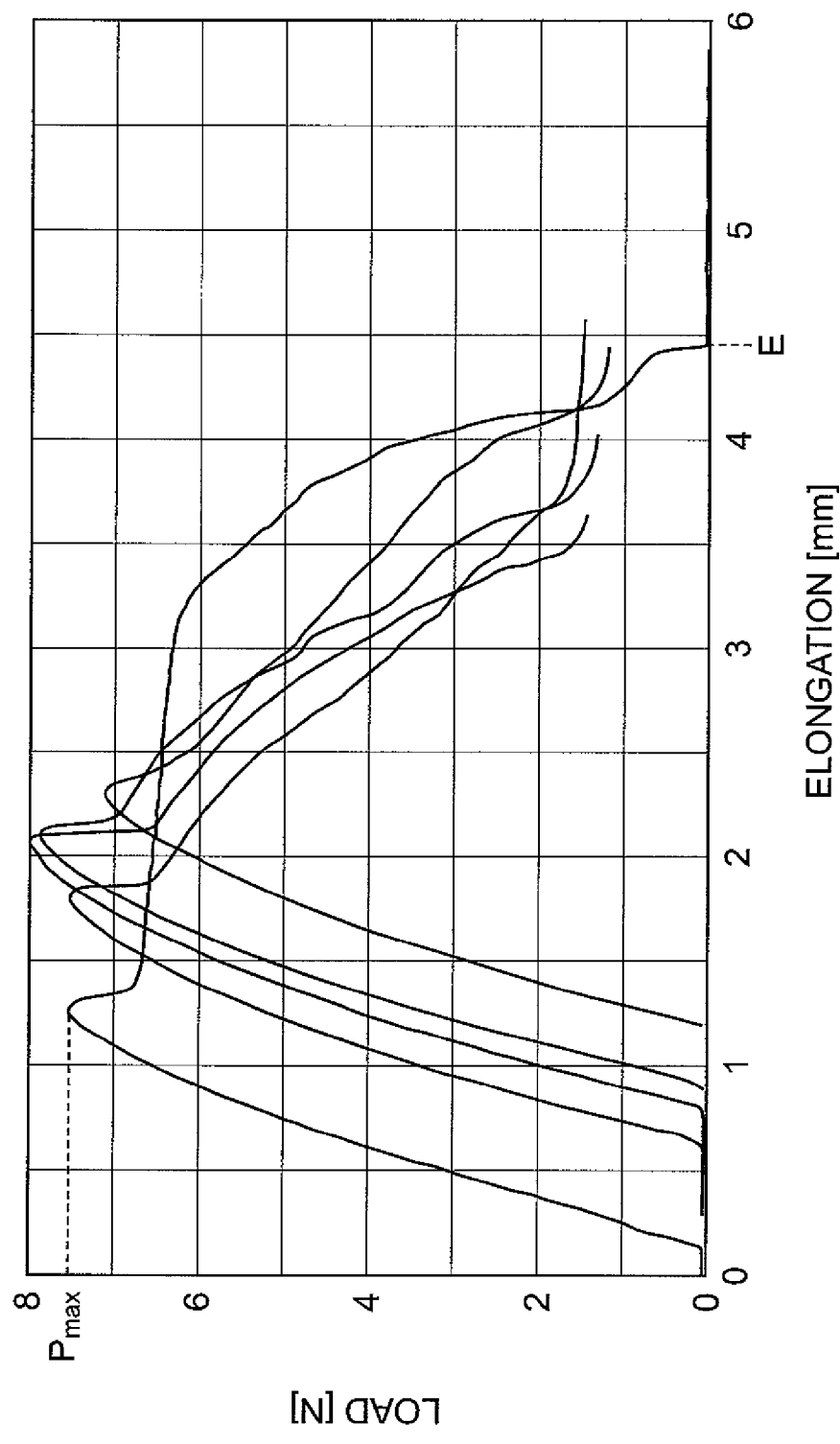
FIG. 12 is a view showing a stress-strain curve for a tensile test of an adhesive film for a semiconductor.

FIG. 11 is a view showing the stress-strain curve for the adhesive film of Example 1, and FIG. 12 is the same for Comparative Example 1. In the views, elongation (mm) =length between chucks−30. The maximum load elongation was calculated from the elongation corresponding to the maximum load Pmax, and the tensile breaking elongation was calculated from the elongation E at the moment at which the load has fallen to 0, after the test piece has ruptured.

(2) Wafer Attachment Temperature

A peel test was conducted in which a hot roll laminator (0.3 m/min, 0.3 MPa) heated to a prescribed temperature was used to attach an adhesive film with a width of 10 mm to a semiconductor wafer and then the adhesive film was pulled off in a 25° C. atmosphere at a pull angle of 90° and a pull speed of 50 mm/min, to determine the peel strength. The peel test was conducted using a UTM-4-100 TENSILON by Toyo Baldwin. The preset temperature of the hot roll laminator was raised from 40° C., 10° C. at a time, and the lowest temperature among the hot roll laminator temperatures at which peel strength of 20 N/m or greater was obtained was recorded as the wafer attachment temperature.

(3) Glass Transition Temperature

Figure 13:
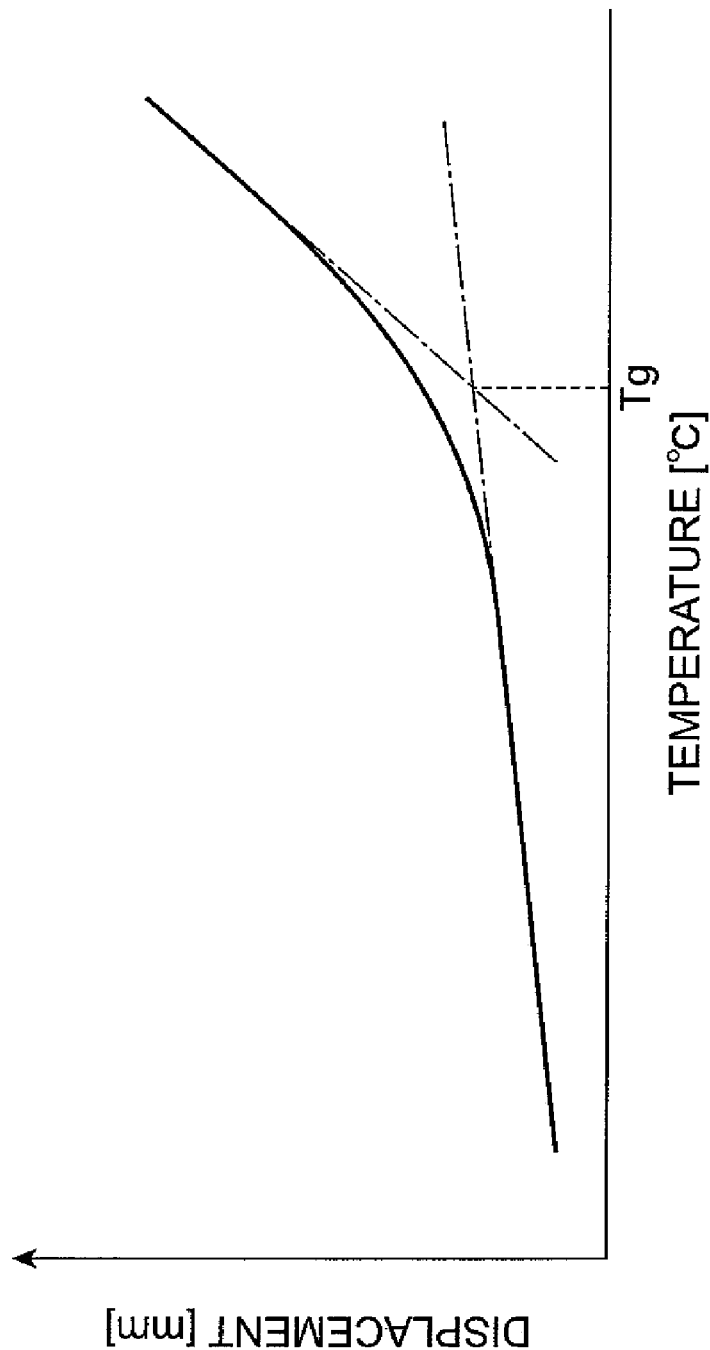
FIG. 13 is a view showing a method of determining the glass transition temperature from the relationship between displacement and temperature.

An approximately 4×20 mm sample was cut out from the adhesive film that had been cured by heating at 180° C. for 1 hour. The displacement of the sample was measured using a TMA120 by Seiko Denshi, with extension, a temperature-elevating speed of 5° C./min and a sample measuring length of 10 mm, and a curve showing the relationship between displacement and temperature was obtained. The glass transition temperature was read from the obtained curve. FIG. 13 is a view showing the relationship between displacement and temperature. As shown in FIG. 13, two tangents were drawn in contact with the section of the curve near the glass transition range, and the temperature at their intersection was recorded as the glass transition temperature (Tg).

(4) Room Temperature Tack Strength

The tack strength of the adhesive film in the B-stage state was measured at 25° C. using a tacking tester by Rhesca Corp., by the method of JISZ0237-1991 (probe diameter: 5.1 mm, pull-off speed: 10 mm/s, contact load: 100 gf/cm², contact time: 1 s). From the viewpoint of workability, the tack strength at 25° C. is preferably less than 5 gf.

(5) Peel Strength (Chip Pull-Off Strength)

Figure 14:
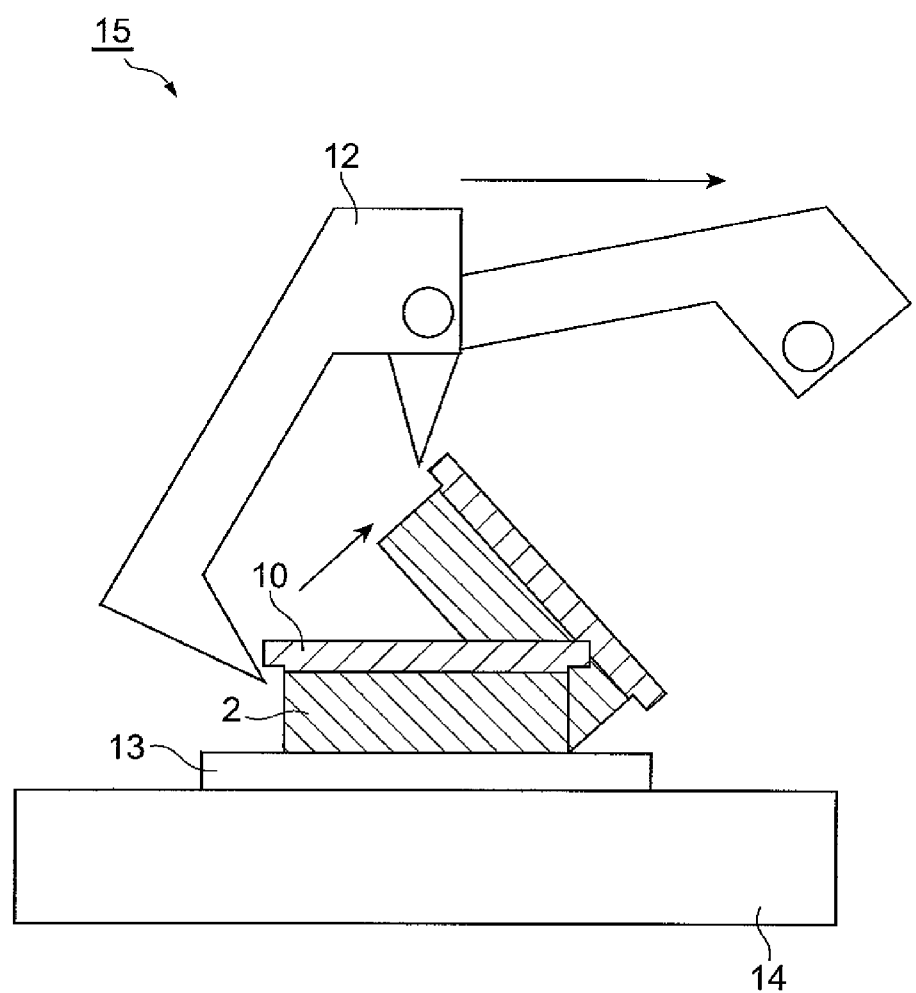
FIG. 14 is a schematic view of a measuring apparatus used for a chip pull off test.

A silicon wafer with a thickness of 400 μm was half-cut from the surface side to a depth of 250 μm and split by force applied in the back-side direction, to prepare 4 mm×2 mm silicon chips having 150 μm-wide raised edges on the perimeter. An adhesive film cut out to a size of 4 mm×2 mm was sandwiched between the silicon chips and 42 alloy lead frame. A load of 200 gf was applied to the entire section and contact bonded therewith at 160° C. for 5 seconds, and then heated at 180° C. for 60 minutes for postcuring of the adhesive film. The chip pull-off strength during heating at 260° C. for 20 seconds was then measured using the measuring apparatus 15 shown in FIG. 14 with a modified push-pull gauge. The measuring apparatus 15 comprised a heating plate 14, a die pad 13 mounted on the heating plate 14, and a push-pull gauge 12. The sample was placed on the die pad 13 of the measuring apparatus 15, and the push-pull gauge 12 was hooked onto the raised edge of the silicon chip to measure the chip peel strength. The peel strength of each sample was measured initially, and after high-temperature, high-humidity treatment for 48 hours in an environment of 85° C., 85% RH. This measurement allows the surface adhesive strength of the adhesive film to be measured. A higher numerical value corresponds to greater resistance to reflow crack formation.

(6) Reflow Crack Resistance

An adhesive film-attached silicon chip comprising a silicon chip cut to a 5 mm square and an adhesive film attached thereto was bonded to a circuit board having wiring formed on the surface of a polyimide film (25 μm thickness) as the base. A separate 5 mm-square adhesive film-attached silicon chip was then bonded to this silicon chip.

Treatment of ten obtained samples was carried out twice, the treatment comprising passing each sample through an IR reflow furnace set so that the surface temperature reached 260° C. and the temperature was held for 20 seconds, and then allowing it to stand at room temperature (25° C.) for cooling. Cracks in the treated samples were observed visually and with an acoustic microscope, to confirm the presence of any board/chip or chip/chip cracks. The reflow crack resistance was evaluated on the following scale, based on the observation results.

A: No cracks found in any of the samples.
C: Cracks occurred in one or more samples.

TABLE 2

|  |  | Units | Examples | | | | Comparative Examples | | | | | |
|---|---|---|---|---|---|---|---|---|---|---|---|---|
|  |  |  | 1 | 2 | 3 | 4 | 1 | 2 | 3 | 4 | 5 | 6 |
| Filler content (boron nitride + AEROSIL) | | wt % | 15 | 15 | 15 | 15 | 9 | 10 | 40 | 28 | 50 | 60 |
| Film thickness | | μm | 25 | 25 | 25 | 25 | 25 | 25 | 25 | 25 | 25 | 25 |
| Wafer attachment temperature | | ° C. | 90 | 90 | 80 | 80 | 140 | 120 | 160 | 40 | 140 | 150 |
| Glass transition temperature | | ° C. | 50 | 48 | 49 | 45 | 68 | 70 | 71 | 20 | 23 | 49 |
| Room temperature tack strength | | gf | 1.2 | 1.5 | 1.6 | 1.3 | 0.6 | 0.7 | 0.5 | 18.1 | 1.0 | 0.8 |
| Tensile properties | Maximum stress | MPa | 42.7 | 42.7 | 45.9 | 42.7 | 60.0 | 54.0 | 23.2 | 0.7 | 5.0 | 22.6 |
|  | Maximum load elongation | % | 2.9 | 2.9 | 2.5 | 2.9 | 3.9 | 3.9 | 12.2 | 306.2 | 185.0 | 2.3 |
|  | Tensile breaking elongation | % | 3.0 | 3.0 | 2.5 | 3.0 | 10.3 | 14.4 | 13.0 | 311.6 | 201.0 | 2.4 |
|  | Tensile breaking elongation/Maximum load elongation | % | 103 | 103 | 100 | 100 | 264 | 369 | 107 | 102 | 109 | 104 |
| Chip pull-off strength | Initial | kg/ 4 × 2 mm | 1.6 | 1.7 | 1.7 | 1.6 | 2.0 | 2.0 | 1.1 | 1.6 | 1.3 | 0.5 |
|  | After 85° C./85%/48 h | | 1.1 | 1.2 | 1.1 | 1.1 | 1.4 | 1.5 | 0.6 | 1.0 | 0.7 | 0.2 |

TABLE 2-continued

|  |  | Units | Examples | | | | Comparative Examples | | | | | |
|---|---|---|---|---|---|---|---|---|---|---|---|---|
|  |  |  | 1 | 2 | 3 | 4 | 1 | 2 | 3 | 4 | 5 | 6 |
| Reflow crack resistance | Board/chip | — | A | A | A | A | A | A | C | A | C | C |
|  | Chip/chip | — | A | A | A | A | A | A | A | A | A | C |

(7) Tear Resistance, Chip Crack and Burrs

Each of the adhesive films produced in the examples and comparative examples described above was attached onto a semiconductor wafer, and the semiconductor wafer was partitioned into semiconductor chips by methods of "full-cutting", "half-cutting" or "laser dicing" described hereunder, after which the tear resistance of the adhesive film and occurrence of chip cracks and burrs were confirmed. Vinyl chloride-based tape (90 μm thickness) was used as the dicing tape for all of the methods.

Full-Cutting

A hot roll laminator (DM-300H by JCM, 0.3 m/min, 0.3 MPa) was used to attach each adhesive film to a 50 μm-thick semiconductor wafer at the wafer attachment temperature listed in Table 1. Next, dicing tape was laminated onto the adhesive film under conditions with a hot plate temperature of 80° C., to prepare a dicing sample. A stainless steel ring was attached around the perimeter of the dicing tape, and a DFD-6361 by DISCO was used to cut the dicing sample. The cutting was performed with a single-cut system in which working is completed with a single blade, under conditions with an NBC-ZH104F-SE 27HDBB blade, a blade rotation rate of 45,000 rpm and a cutting speed of 50 mm/s. The blade height (cutting depth) during cutting was 80 μm, as a height allowing complete cutting of the adhesive film. Next, the dicing tape was stretched out with an expanding apparatus, with the ring in an anchored state. The expanding speed was 10 mm/s and the expanding volume was 3 mm.

Half-Cutting

A test was conducted under the same conditions as full-cutting, except that the blade height (cutting depth) was 100 μm, as a height leaving a 10 μm-thick section of the die bond film uncut.

Laser Dicing

The semiconductor wafer (50 μm thickness) was subjected to laser irradiation to form reformed sections therein along the lines demarcating the semiconductor chips. Adhesive film and dicing tape were then attached in that order, by the same procedure as for full-cutting, and a stainless steel ring was attached around the outer periphery of the dicing tape. Next, the dicing tape was stretched out with an expanding apparatus, with the ring in an anchored state. The expanding speed was 30 mm/s and the expanding volume was 15 mm.

Tear Resistance

After stretching out the dicing tape, the presence of any tearing of the adhesive film was observed with an optical microscope, the length of the completely cleaved section as a proportion of the total length of the cut surface was determined, and the proportion was classified according to the scale shown below to evaluate the tear resistance. The tear resistance was not evaluated for full-cutting, since the adhesive film was cut with a dicing blade.

AA: $\geq 98\%$
A: $\geq 90\%$
B: $\geq 50\%$ and $<90\%$
C: $<50\%$

Chip Cracking

After stretching out the dicing tape, the condition of chip cracking was observed with an optical microscope. The length of chip cracks formed on the side of the semiconductor chip opposite the adhesive film was classified according to the scale shown below to evaluate the condition of chip cracking.

AA: $<5$ μm
A: $\geq 5$ μm and $<10$ μm
B: $\geq 10$ and $<25$ μm
C: $\geq 25$ μm Burrs After stretching out the dicing tape, the semiconductor chips were picked up together with the adhesive film. The edges of the adhesive film-attached semiconductor chips that had been picked up were observed with an optical microscope to confirm the condition of burrs.

AA: Burr lengths of $<20$ μm
A: Burr lengths of $\geq 20$ μm and $<40$ μm
B: Burr lengths of $\geq 40$ and $<100$ μm
C: Burr lengths of $\geq 100$ μm

TABLE 3

|  |  | Units | Examples | | | | Comparative Examples | | | | | |
|---|---|---|---|---|---|---|---|---|---|---|---|---|
|  |  |  | 1 | 2 | 3 | 4 | 1 | 2 | 3 | 4 | 5 | 6 |
| Full-cutting | Expanding volume | mm | 3 | 3 | 3 | 3 | 3 | 3 | 3 | 3 | 3 | 3 |
|  | Chip cracks | — | B | B | B | B | B | B | B | C | C | B |
|  | Burrs | — | B | B | B | B | B | B | B | C | C | B |
| Half-cutting | Expanding volume | mm | 3 | 3 | 3 | 3 | 3 | 3 | 3 | 3 | 3 | 3 |
|  | Tear resistance | — | AA | AA | AA | AA | C | C | A | C | C | AA |
|  | Chip cracks | — | A | A | A | A | — | — | A | — | — | A |
|  | Burrs | — | AA | AA | AA | AA | — | — | AA | — | — | AA |
| Laser | Expanding | mm | 15 | 15 | 15 | 15 | 15 | 15 | 15 | 15 | 15 | 15 |

TABLE 3-continued

| | | Units | Examples | | | | Comparative Examples | | | | | |
|---|---|---|---|---|---|---|---|---|---|---|---|---|
| | | | 1 | 2 | 3 | 4 | 1 | 2 | 3 | 4 | 5 | 6 |
| dicing | volume Tear resistance | — | AA | AA | AA | AA | C | C | C | C | C | AA |
| | Chip cracks | — | AA | AA | AA | AA | — | — | — | — | — | AA |
| | Burrs | — | AA | AA | AA | AA | — | — | — | — | — | AA |

The adhesive films of Examples 1-4, employing polyimide resins obtained by reaction between a tetracarboxylic dianhydride containing 50 wt % 4,4'-oxydiphthalic dianhydride and a diamine containing at least 30 wt % 1,3-bis(3-aminopropyl)tetramethyldisiloxane, were all attachable to semiconductor wafers at 100° C. or below. All of the adhesive films of Examples 1-4 also had satisfactory tear resistance. In addition, the adhesive films of Examples 1-4 were superior in terms of reflow crack resistance, and also in terms of workability because of their suitable tack strength at room temperature.

The adhesive films of Comparative Examples 1-3, employing polyimide resins obtained without using 4,4'-oxydiphthalic dianhydride, were not attachable to semiconductor wafers at 100° C. or below, and failed to exhibit sufficient tear resistance. The adhesive film of Comparative Example 6 employed the same type of polyimide resin as Example 3 but had a greater filler content, and it was not attachable to a semiconductor wafer at 100° C. or below. The adhesive film of Comparative Example 3 exhibited satisfactory tear resistance with half-cutting, but the tear resistance with laser dicing was inadequate. The adhesive film of Comparative Example 3 exhibited board/chip cracking in a reflow crack resistance test.

The adhesive film of Comparative Example 4, which employed a polyimide resin obtained without using 4,4'-oxydiphthalic dianhydride, was attachable to a semiconductor wafer at 100° C. or below but the tack strength was excessively high at room temperature due to a low glass transition temperature, and workability was therefore impaired. The adhesive film of Comparative Example 4 was also unsatisfactory in terms of tear resistance.

The adhesive film of Comparative Example 5, which had an increased filler content while using the same polyimide resin as Comparative Example 4, was not attachable to a semiconductor wafer at a temperature of 100° C. or below, and failed to exhibit sufficient tear resistance. It also exhibited board/chip cracking in a reflow crack resistance test.

The adhesive film of Comparative Example 6, obtained using the same polyimide resin as Example 3, exhibited satisfactory tear resistance but because it had a high filler content it was not attachable to a semiconductor wafer at 100° C. or below. It also exhibited board/chip cracking in a reflow crack resistance test.

As clearly seen by the experimental results described above, it was confirmed that it is possible to accomplish attachment to semiconductor wafers at 100° C. or below, and to obtain semiconductor chips from a semiconductor wafer at high yield while sufficiently inhibiting formation of chip cracks and burrs.

The invention claimed is:

1. A method for producing a semiconductor chip comprising the steps of:
    preparing a laminated body having a semiconductor wafer, an adhesive film for a semiconductor and dicing tape laminated in that order, the semiconductor wafer being partitioned into multiple semiconductor chips and notches being formed in the adhesive film for a semiconductor from the semiconductor wafer side so that at least a portion of the adhesive film for a semiconductor remains uncut in its thickness direction, and
    stretching out the dicing tape in a direction so that the multiple semiconductor chips are separated apart, to separate the adhesive film for a semiconductor along the notches,
    wherein the adhesive film for a semiconductor comprises a polyimide resin that can be obtained by reaction between a tetracarboxylic dianhydride containing 4,4'-oxydiphthalic dianhydride represented by chemical formula (I) below at 50% by mass or greater of the whole, and a diamine containing a siloxanediamine represented by the following general formula (II) below at 30% by mass or greater of the whole, and which can be attached to a semiconductor wafer at 100° C. or below:

[Chemical Formula 1]

(I)

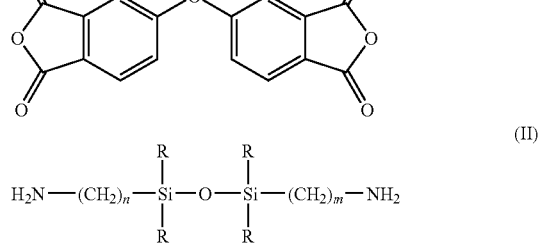

(II)

[In formula (II), R represents a C1-5 alkyl, C1-5 alkoxy, phenyl or phenoxy group, and multiple R groups in the same molecule may be the same or different, while n and m each independently represent an integer of 1-3].

2. The method for producing a semiconductor chip according to claim 1, wherein the glass transition temperature of the polyimide resin is from 30° C. to 80° C.

3. The method for producing a semiconductor chip according to claim 1,
    wherein the adhesive film further comprises a thermosetting component and a filler, and
    has a filler content of less than 30% by mass with respect to the mass of the adhesive film for a semiconductor.

4. The method for producing a semiconductor chip according to claim 1, wherein said preparing the laminated body includes attaching the adhesive film to the semiconductor wafer at a temperature of 100° C. or less.

5. The method for producing a semiconductor chip according to claim 1, wherein the adhesive film is attached to the semiconductor wafer with the temperature of the adhesive film being kept at 0-100° C.

6. The method for producing a semiconductor chip according to claim 1, wherein the notches are formed in the adhesive film such that a depth $T_2$ of the notches, to a total thickness $T_1$ of the adhesive film, $T_2/T_1$, is 1/5 to 4/5.

7. The method for producing a semiconductor chip according to claim 6, wherein $T_2/T_1$ is 1/3 to 2/3.

* * * * *